United States Patent
Ikenoue et al.

(10) Patent No.: US 10,475,650 B2
(45) Date of Patent: Nov. 12, 2019

(54) LASER DOPING DEVICE AND SEMICONDUCTOR DEVICE MANUFACTURING METHOD

(71) Applicants: KYUSHU UNIVERSITY, NATIONAL UNIVERSITY CORPORATION, Fukuoka (JP); GIGAPHOTON INC., Tochigi (JP)

(72) Inventors: Hiroshi Ikenoue, Fukuoka (JP); Akira Suwa, Oyama (JP); Osamu Wakabayashi, Oyama (JP)

(73) Assignees: KYUSHU UNIVERSITY, NATIONAL UNIVERSITY CORPORATION, Fukuoka (JP); Gigaphoton Inc., Tochigi (JP)

( * ) Notice: Subject to any disclaimer, the term of this patent is extended or adjusted under 35 U.S.C. 154(b) by 0 days.

(21) Appl. No.: 16/055,287

(22) Filed: Aug. 6, 2018

(65) Prior Publication Data
US 2018/0342397 A1 Nov. 29, 2018

Related U.S. Application Data

(63) Continuation of application No. PCT/JP2016/059338, filed on Mar. 24, 2016.

(51) Int. Cl.
 *H01L 21/228* (2006.01)
 *H01L 21/268* (2006.01)
 (Continued)

(52) U.S. Cl.
 CPC ........ *H01L 21/228* (2013.01); *B23K 26/0006* (2013.01); *B23K 26/0604* (2013.01);
 (Continued)

(58) Field of Classification Search
 None
 See application file for complete search history.

(56) References Cited

U.S. PATENT DOCUMENTS

2005/0003594 A1   1/2005  Koezuka et al.
2013/0273749 A1  10/2013  Mizumura et al.
(Continued)

FOREIGN PATENT DOCUMENTS

JP  H01-313930 A  12/1989
JP  H09-027460 A   1/1997
(Continued)

OTHER PUBLICATIONS

International Search Report issued in PCT/JP2016/059338; dated Apr. 19, 2016.
(Continued)

*Primary Examiner* — Thien F Tran
(74) *Attorney, Agent, or Firm* — Studebaker & Brackett PC

(57) ABSTRACT

A laser doping device includes: a solution supply system configured to supply a solution containing dopant to a doping region; a pulse laser system configured to output pulse laser light including a plurality of pulses, the pulse laser light transmitting through the solution; a first control unit configured to control a number of pulses of the pulse laser light for allowing the doping region to be irradiated, and to control a fluence of the pulse laser light in the doping region; and a second control unit configured to control a flow velocity of the solution so as to move bubbles, from the doping region, occurring in the solution every time of irradiation with the pulse.

12 Claims, 21 Drawing Sheets

(51) Int. Cl.
*B23K 26/00* (2014.01)
*B23K 26/06* (2014.01)
*B23K 26/067* (2006.01)
*B23K 26/073* (2006.01)
*B23K 26/08* (2014.01)
*B23K 26/354* (2014.01)
*B23K 26/0622* (2014.01)
*B23K 26/066* (2014.01)
*B23K 26/12* (2014.01)
*B23K 103/00* (2006.01)
*B23K 101/34* (2006.01)
*B23K 101/40* (2006.01)
*B23K 103/16* (2006.01)
*B23K 103/18* (2006.01)

(52) U.S. Cl.
CPC ........ *B23K 26/066* (2015.10); *B23K 26/0622* (2015.10); *B23K 26/0643* (2013.01); *B23K 26/0648* (2013.01); *B23K 26/0676* (2013.01); *B23K 26/0732* (2013.01); *B23K 26/0861* (2013.01); *B23K 26/1224* (2015.10); *B23K 26/354* (2015.10); *H01L 21/268* (2013.01); *B23K 2101/34* (2018.08); *B23K 2101/40* (2018.08); *B23K 2103/172* (2018.08); *B23K 2103/18* (2018.08); *B23K 2103/54* (2018.08)

(56) References Cited

U.S. PATENT DOCUMENTS

2016/0284547 A1    9/2016   Iguchi et al.
2017/0365475 A1*  12/2017   Ohkubo ............... H01L 21/0455
2019/0131173 A1*   5/2019   Nomaru ............. B23K 26/1464

FOREIGN PATENT DOCUMENTS

| JP | 2005-079299 A | 3/2005 |
| JP | 2007-079590 A | 3/2007 |
| JP | 4387091 B2 | 12/2009 |
| JP | 4409231 B2 | 2/2010 |
| JP | 2012-124366 A | 6/2012 |
| JP | 2012-243818 A | 12/2012 |
| JP | 2014-139991 A | 7/2014 |
| WO | 2015/189875 A1 | 12/2015 |

OTHER PUBLICATIONS

The International Preliminary Report on Patentability and Translation of Written Opinion of the International Searching Authority; PCT/JP2016/059338; dated Sep. 25, 2018.

Koji Nishi et al., "Phosphorus Doping into 4H—SiC by Irradiation of Excimer Laser in Phosphoric Solution", Japanese Journal of Applied Physics 52, 2013, 4 pages.

* cited by examiner

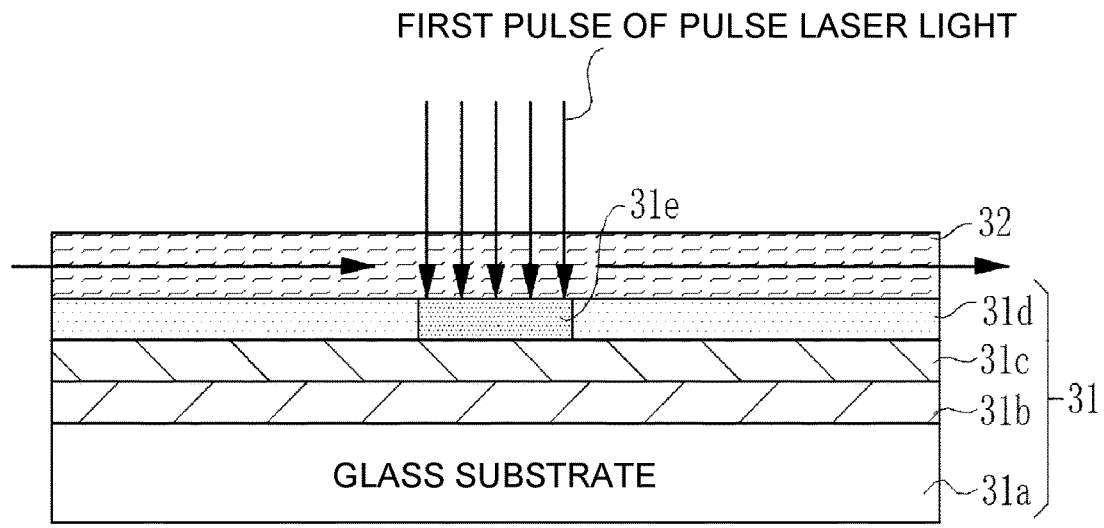
FIG.5A
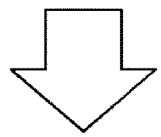
FIG.5B
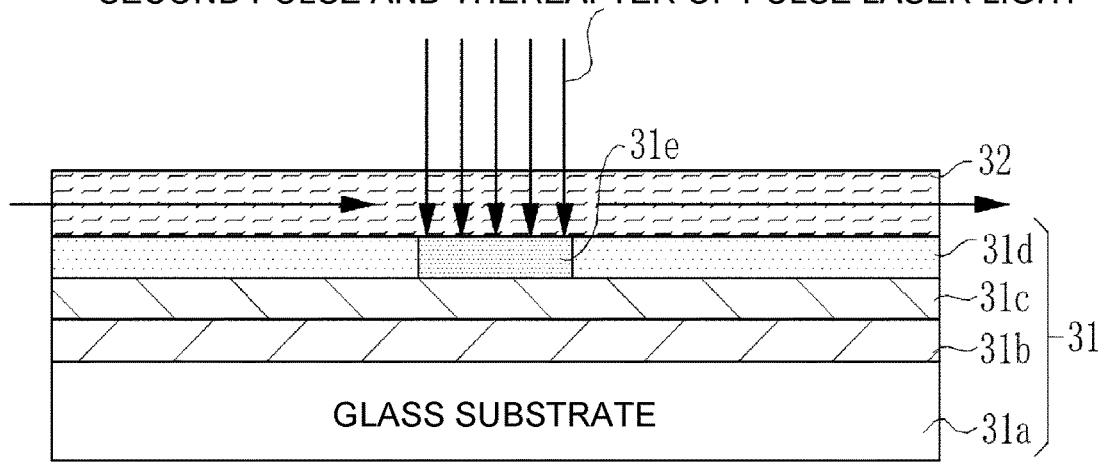

RECTANGULAR BEAM

RECTANGULAR BEAM

RECTANGULAR BEAM

LASER DOPING DEVICE AND SEMICONDUCTOR DEVICE MANUFACTURING METHOD

CROSS-REFERENCE TO RELATED APPLICATIONS

The present application is a continuation application of International Application No. PCT/JP2016/059338 filed on Mar. 24, 2016. The content of the application is incorporated herein by reference in its entirety.

BACKGROUND

1. Technical Field

The present disclosure relates to a laser doping device and a semiconductor device manufacturing method.

2. Related Art

A TFT substrate, which includes thin film transistors (TFTs) formed on a substrate, is used for a liquid crystal display (LCD). In the liquid crystal display, the TFTs function as switching elements that drive pixels made up of liquid crystal cells.

While it is common to use a glass substrate for the TFT substrate, a flexible substrate made of resin for the TFT substrate has also been developed. Amorphous silicon (a-Si) or polysilicon (poly-Si) is used as a TFT material. Polysilicon has a carrier mobility that is two orders of magnitude higher than that of amorphous silicon. Accordingly, it has been known that use of polysilicon significantly improves the TFT characteristics.

Polysilicon is used to form n-type or p-type semiconductor through doping that implants dopant (impurities) into polysilicon. A doping method may be, for example, an ion implantation doping method that involves ion implantation and high-temperature activation treatment. The ion implantation is a process of ionizing and implanting dopant, and is a high vacuum process to be performed in a chamber in a high vacuum state. The high-temperature activation treatment is a treatment for diffusing the implanted dopant, and is a high-temperature process because a temperature of a substrate reaches 400° C. to about 1,000° C. or higher.

A flexible substrate that is soft and has a low melting point can be resistant to neither the high vacuum process nor the high-temperature activation treatment. Consequently, it is difficult to apply the ion implantation doping method to the flexible substrate. Also in a case where a glass substrate is used, a heat resistant glass substrate that is resistant to the high-temperature process is required. Consequently, it is difficult to apply the ion implantation doping method to a typical glass substrate having a lower melting point than that of the heat resistant glass substrate.

Non-Patent Literature 1 and Patent Literatures 1 to 5 described below disclose doping methods through laser irradiation that can dope even substrates having a relatively low melting point. According to the doping method through laser irradiation, first, a solution that contains dopant is supplied to a doping region where doping for polysilicon is to be performed. Methods of supplying the solution containing the dopant include a method of applying the solution containing the dopant onto the surface of polysilicon on the substrate, or a method of soaking the substrate on which polysilicon is formed, in a vessel that retains the solution containing the dopant.

Next, in the state where the solution containing the dopant has been supplied, pulse laser light is emitted toward the polysilicon. The pulse laser light transmits through the solution containing the dopant, and reaches the polysilicon. The polysilicon is melted by being irradiated with the pulse laser light. The polysilicon is thus melted which simultaneously accomplishes implantation of the solution containing the dopant, and the activation treatment of diffusing the implanted dopant in the polysilicon. In this way, the doping method through laser irradiation can achieve doping in a low-temperature process.

CITATION LIST

Non-Patent Literature

Non-Patent Literature 1: Koji Nishi, Akihiro Ikeda, Hiroshi Ikenoue, and Tanemasa Asano, "Phosphorus doping into 4H-SiC by Irradiation of Excimer Laser in Phosphoric Solution", Japanese Journal of Applied Physics 52 (2013)

PATENT LITERATURE

Patent Literature 1: Japanese Patent No. 4409231
Patent Literature 2: Japanese Patent No. 4387091
Patent Literature 3: Japanese Patent Application Laid-Open No. 2014-139991
Patent Literature 4: Japanese Patent Application Laid-Open No. 2012-124366
Patent Literature 5: Japanese Patent Application Laid-Open No. 2012-243818

SUMMARY

A laser doping device according to one aspect of the present disclosure is a laser doping device for doping polysilicon on a substrate with dopant, including: a solution supply system; a pulse laser system; an optical system; a first control unit; and a second control unit. The solution supply system supplies a solution containing the dopant to a doping region to be subjected to the doping. The pulse laser system outputs pulse laser light including a plurality of pulses, the pulse laser light transmitting through the solution and melting the polysilicon in the doping region by allowing the doping region to be irradiated. The optical system guides the pulse laser light output from the pulse laser system, to the doping region. The first control unit controls the number of pulses of the pulse laser light for allowing the doping region to be irradiated, and the fluence of the pulse. The second control unit controls the flow velocity of the solution so as to move bubbles, from the doping region, occurring in the solution every time of irradiation with the pulse.

A semiconductor device manufacturing method according to another aspect of the present disclosure is a semiconductor device manufacturing method of doping semiconductor with dopant and manufacturing a semiconductor device, including: a first step, a second step, a third step, and a fourth step. The first step forms at least one film on the semiconductor. The second step partially removes the film formed in the doping region to be subjected to doping, in a region where the film is formed. The third step causes a solution to flow to the semiconductor including the doping region. The fourth step emits pulse laser light including a plurality of pulses during execution of the third step, the pulse laser light transmitting through the solution and melting the semiconductor in the doping region by allowing the doping region to be irradiated.

BRIEF DESCRIPTION OF THE DRAWINGS

Some embodiments of the present disclosure will be described below as just examples with reference to the accompanying drawings.

FIGS. 5A and 5B are diagrams illustrating a working effect of the first embodiment;

EMBODIMENTS

<Contents>
1. Overview
2. Laser doping device according to comparative example
    2.1 Configuration of laser doping device
    2.2 Operation of laser doping device
    2.3 Problem
3. Laser doping device in first embodiment
    3.1 Configuration
    3.2 Operation
    3.3 Working effect
    3.4 Fluence range suitable for doping
    3.5 Range of the number of pulses suitable for doping
    3.6 First example of semiconductor device manufacturing method
    3.7 Second example of semiconductor device manufacturing method
    3.8 Other
4. Laser doping device in second embodiment
    4.1 Configuration
    4.2 Operation
    4.3 Working effect
    4.4 Other
5. Laser doping device in third embodiment
    5.1 Configuration
    5.2 Operation
    5.3 Working effect
6. Laser doping device in fourth embodiment
    6.1 Configuration
    6.2 Operation
    6.3 Working effect
7. Details of pulse laser device Hereinafter, embodiments of the present disclosure will be described in detail with reference to the drawings. The embodiments described below illustrate some examples of the present disclosure, and do not limit the contents of the present disclosure. Further, all of the configurations and the operations described in the embodiments are not always indispensable as configurations and operations of the present disclosure. It should be noted that the same constituent elements are denoted by the same reference signs, and overlapping description is omitted.

1. Overview

The present disclosure relates to a laser doping device that dopes a semiconductor material by irradiating the semiconductor material with pulse laser light in an ultraviolet range in a solution containing dopant and a semiconductor device manufacturing method.

Figure 1:
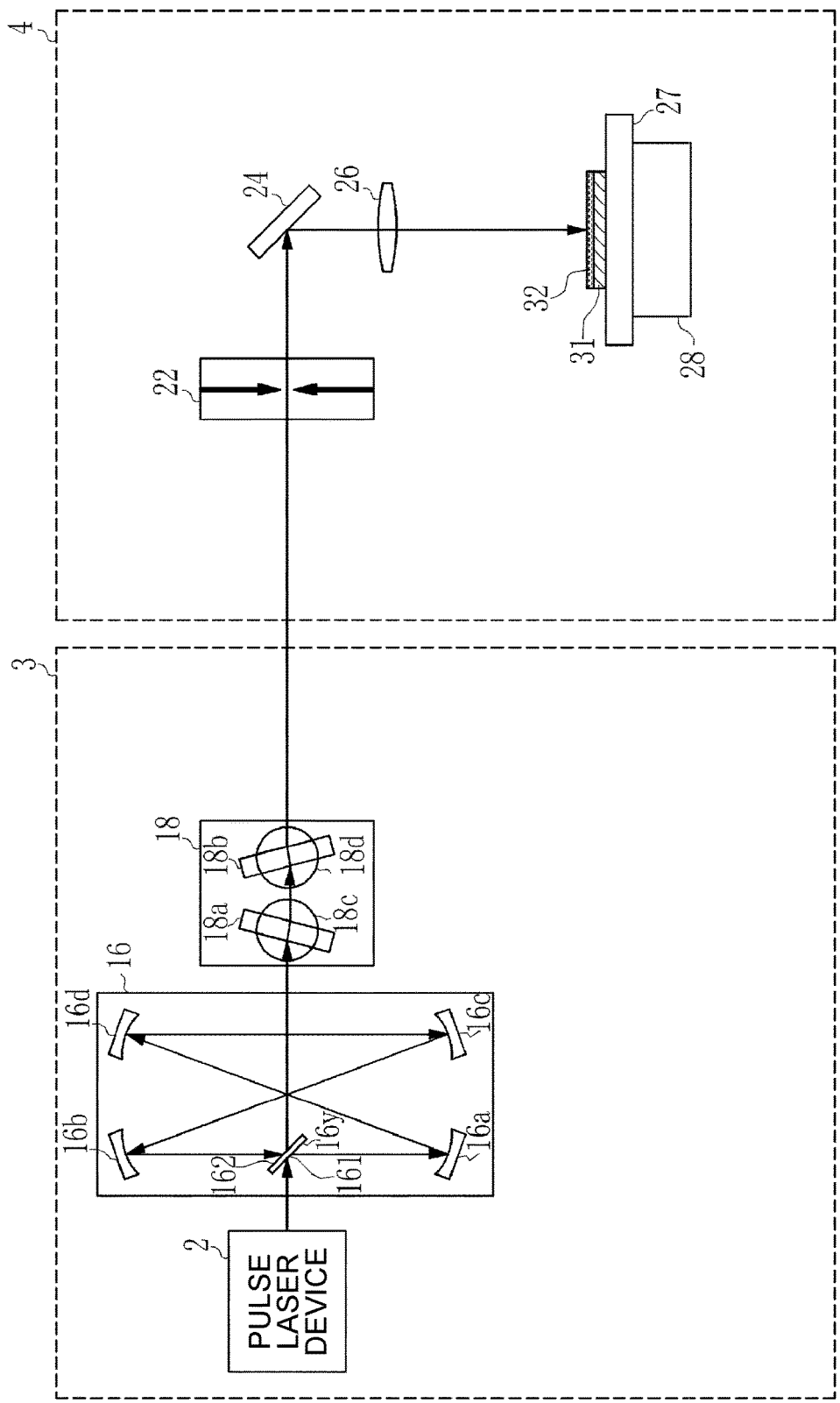
FIG. 1 schematically illustrates a configuration of a laser doping device according to a comparative example.

2. Laser Doping Device According to Comparative Example 2.1 Configuration of Laser Doping Device FIG. 1 schematically illustrates a configuration of a laser doping device according to a comparative example. The laser doping device includes a laser system 3, and a doping device 4.

The laser system 3 includes a pulse laser device 2, an optical pulse stretcher 16, and an attenuator 18. The pulse laser device 2 is an excimer pulse laser device that outputs pulse laser light in an ultraviolet range. The wavelength of the pulse laser light is a wavelength transmissible with a high transmittance through the solution containing the dopant used in the doping device 4 and has a small damage on the semiconductor material, which is an irradiation object. More specifically, the central wavelength of the pulse laser light ranges from about 193 nm to about 355 nm.

The pulse laser device 2, which emits the pulse laser light in this wavelength range, is a pulse laser device that adopts ArF, KrF, XeCl or XeF as a laser medium, for example. In a case of an ArF excimer pulse laser device, the pulse laser light has a central wavelength of about 193.4 nm. In a case of an KrF excimer pulse laser device, the pulse laser light has a central wavelength of about 248.4 nm. In a case of an XeCl excimer pulse laser device, the pulse laser light has a central wavelength of about 308 nm. In a case of an XeF excimer pulse laser device, the pulse laser light has a central wavelength of about 351 nm.

Instead of the excimer pulse laser device, a solid-state pulse laser device may be used. The solid-state pulse laser device is a combination of a solid-state pulse laser device having a central wavelength of about 1 µm (1064 nm), and a wavelength conversion device that applies wavelength conversion to pulse laser light using non-linear crystal. The wavelength conversion device converts the pulse laser light having a central wavelength of about 1 µm into the third harmonic wave having a central wavelength of 355 nm or the fourth harmonic wave having a central wavelength of 226 nm. The pulse laser device having a central wavelength of with about 1 µm may be a YAG (Yttrium Aluminum Garnet) laser device or a Yb fiber laser device.

The optical pulse stretcher 16 is disposed on the optical path of the pulse laser light output from the pulse laser device 2. The optical pulse stretcher 16 performs pulse stretching that extends the pulse time width of the pulse laser light output from the pulse laser device 2, and generates pulse laser light having a long pulse time width. The pulse time width of the pulse laser light that has been output from the pulse laser device 2 and has not been pulse-stretched yet is, for example, 50 nsec. The optical pulse stretcher 16 pulse-stretches the pulse time width to about 80 nsec, for example. The optical pulse stretcher 16 includes, for example, a beam splitter 16y and concave mirrors 16a to 16d. Here, the pulse time width has a value calculated by the following expression.

$$\text{Pulse time width } \Delta T_{TIS} = [\int I(t)dt]^2 / \int I(t)^2 dt$$

In the above expression, t is time, and I(t) is a value of an optical intensity at time t.

The beam splitter 16y includes a substrate that transmits the pulse laser light with a high transmittance. A first surface 161 of the substrate may be coated with an anti-reflection film. A second surface 162 of the substrate may be coated with a partial reflection film. The beam splitter 16y is held by a holder, not illustrated. The concave mirrors 16a to 16d constitute a delay optical system. Each of the concave mirrors 16a to 16d is a concave mirror having a substantially identical focal length F. The focal length F corresponds to, for example, a distance from the beam splitter 16y to the concave mirror 16a.

The pulse laser light incident on the beam splitter 16y from the left side in the diagram enters the first surface 161 with a high transmittance and then enters the partial reflection film of the second surface 162. The pulse laser light entering the second surface 162 is branched to a first optical path and a second optical path. That is, a part of the pulse laser light having entered the beam splitter 16y from the left side in the diagram transmits and travels on the first optical path and becomes a first output pulse. The first output pulse enters the attenuator 18 without intervention of the concave mirrors 16a to 16d. Meanwhile, the other part of the pulse laser light having entered the beam splitter 16y from the left side in the diagram is reflected, travels on the second optical path, and is reflected by the concave mirror 16a.

The pulse laser light reflected by the concave mirror 16a is reflected by the concave mirrors 16d, 16c and 16b sequentially in this order, and enters the beam splitter 16y from the upper side in the diagram. A part of the pulse laser light having entered the beam splitter 16y from the upper side in the diagram is reflected and travels on the first optical path and becomes a second output pulse. The other part of the pulse laser light having entered the beam splitter 16y from the upper side in the diagram transmits through the beam splitter 16y and travels again on the second optical path.

The first output pulse having entered the beam splitter 16y from the left side in the diagram and transmitted through this splitter, and the second output pulse having entered the beam splitter 16y from the upper side in the diagram and been reflected, are output on a substantially identical optical path axis from the optical pulse stretcher 16 toward the right in the diagram. The optical path length of the delay optical path with intervention of the concave mirrors 16a to 16d may correspond to what is four times as long as the focal length F of each of the concave mirrors 16a to 16d. In this case, the delay time of the second output pulse from the first output pulse is 4F/c, where c is the light speed. The image of a section of the beam of pulse laser light on the second surface 162 of the beam splitter 16y passes through the delay optical path and enters the second surface 162 again, thus forming a normal image on the second surface.

The pulse laser light having entered the beam splitter 16y from the upper side in the diagram and transmitted through this splitter is reflected by the concave mirror 16a again, passes through the delay optical path, which is the same as described above, and enters the beam splitter 16y again from the upper side in the diagram. A part of the pulse laser light having entered the beam splitter 16y again from the upper side in the diagram is reflected and is output from the optical pulse stretcher 16 toward the right in the diagram. Repetition of this process outputs third and fourth output pulses, not illustrated, on the optical path axis substantially identical to the optical axis of the first and second output pulses, and these output pulses are combined, thus pulse-stretching the pulse laser light.

FIG. 1 illustrates the example of including the four concave mirrors. However, the present disclosure is not limited to this example. A greater number of concave mirrors may be disposed in an analogous manner.

The attenuator 18 is disposed on the optical path of the pulse laser light output from the pulse laser device 2, and includes, for example, two partially reflective mirrors 18a and 18b, and rotary stages 18c and 18d for the respective partially reflective mirrors. The two partially reflective mirrors 18a and 18b are optical elements that have a transmittance changing according to the incident angle of the pulse laser light.

The doping device 4 includes a slit 22, a highly reflective mirror 24, a transfer optical system 26, a table 27, and an XYZ stage 28. The slit 22 is disposed on the optical path of the pulse laser light having passed through the attenuator 18. The slit 22 is, for example, a slit that has two axes substantially orthogonal to each other. The slit 22 is disposed such that a region having a uniform optical intensity distribution in the beam section of the pulse laser light can pass.

The highly reflective mirror 24 reflects the pulse laser light in the ultraviolet range output from the pulse laser device 2, with a high reflectance. The highly reflective mirror 24 is disposed so as to reflect the pulse laser light having passed through the slit 22 and to allow the reflected light to enter the transfer optical system 26.

The transfer optical system 26 transfers an image of the pulse laser light having a uniform optical intensity onto an irradiation object 31 to be irradiated with the pulse laser light. The transfer optical system 26 corresponds to an optical system according to claims. The transfer optical system 26 may be an optical system that includes one or more convex lenses, or may be an optical system that includes one or more convex lenses and one or more concave lenses. The transfer optical system 26 may be a lens compensated for chromatic aberration with respect to the wavelengths of the ultraviolet-region light. For example, the transfer optical system 26 may include a plurality of lenses made of materials of synthetic quartz and calcium fluoride.

The table 27 supports the irradiation object 31. The irradiation object 31 is an object to be irradiated with the pulse laser light and be subjected to doping. For example, this object is an intermediate product for production of a TFT substrate. The XYZ stage 28 supports the table 27. The XYZ stage 28 can adjust the position of the irradiation object 31 by adjusting the position of the table 27. The XYZ stage 28 adjusts the position of the irradiation object 31 such that the doping region, which is on the surface of the irradiation object 31 and is to be subjected to doping, can be irradiated with the pulse laser light having transmitted through the transfer optical system 26.

Figure 2A:
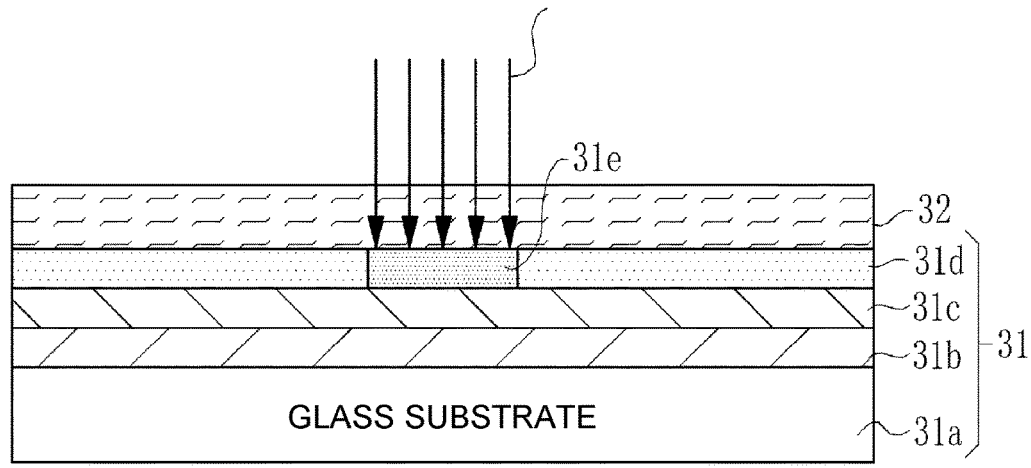
FIGS. 2A and 2B are diagrams illustrating a problem of the comparative example.
Figure 2A:
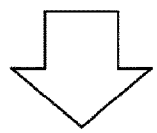
Figure 2B:
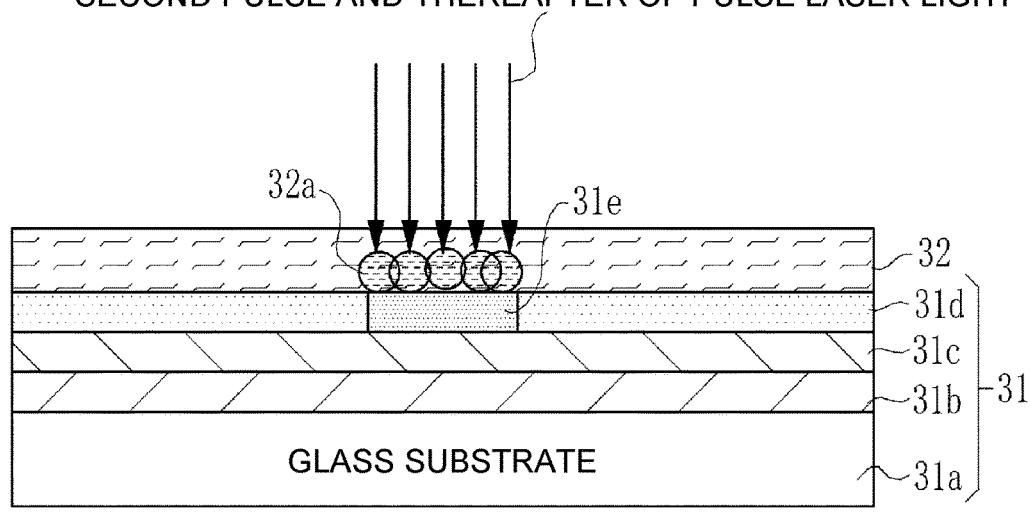

As illustrated in FIGS. 2A and 2B, the irradiation object 31 includes, for example, a glass substrate 31a, underlaying insulating films 31b and 31c formed on the glass substrate 31a, and a polysilicon film 31d formed on the underlaying insulating films 31b and 31c. The underlaying insulating films 31b and 31c are, for example, a silicon nitride film (SiN) and a silicon oxide film ($SiO_2$). The polysilicon film 31d is a thin film made of polysilicon (poly-Si), and is an object to be subjected to doping. When the doping is performed, a solution 32 containing dopant is supplied onto the polysilicon film 31d. Hereinafter, the solution 32 containing the dopant is simply called the solution 32. The solution 32 is, for example, aluminum chloride aqueous solution that contains aluminum as dopant, boric acid solution that contains boric acid as dopant, ammonia aqueous solution that contains nitrogen as dopant, or phosphoric acid aqueous solution that contains phosphorus as dopant.

2.2 Operation of Laser Doping Device

The pulse laser light output from the pulse laser device 2 enters the optical pulse stretcher 16. The optical pulse stretcher 16 outputs the pulse-stretched pulse laser light obtained by pulse-stretching the pulse laser light. The postures of two partially reflective mirrors 18a and 18b included in the attenuator 18 are controlled by the respective rotary stages 18c and 18d such that the incident angles of the pulse laser light can be substantially identical to each other and the transmittance of the pulse laser light can be a desired transmittance. Thereby, the pulse laser light output from the optical pulse stretcher 16 is reduced to have a desired pulse energy while passing the attenuator 18.

The pulse laser light having passed through the attenuator 18 passes through the slit 22 having two orthogonal axes, and enters the transfer optical system 26 via the highly reflective mirror 24. The transfer optical system 26 forms a transferred image of the slit 22 with the ultraviolet-region light, on the surface of the irradiation object 31. That is, the pulse laser light transmits through the solution 32, and the surface of the polysilicon film 31d is irradiated with this light. The transfer optical system 26 is an optical system that guides the pulse laser light onto the region that includes the doping region 31e. In the doping region 31e to be irradiated with the pulse laser light and subjected to doping, the polysilicon film 31d is melted, and the dopant in the solution 32 is implanted into the polysilicon film 31d. The polysilicon film 31d is thus melted which simultaneously performs the activation treatment of diffusing the implanted dopant in the polysilicon film 31d. In this way, the irradiation with the pulse laser light can achieve doping in a low-temperature process.

2.3 Problem

As illustrated in FIG. 2A, when the polysilicon film 31d is irradiated with the pulse laser light through the solution 32, a first pulse of the pulse laser light transmits through the solution 32 and reaches the doping region 31e. However, as illustrated in FIG. 2B, the irradiation with the first pulse causes bubbles 32a on the surface of the doping region 31e in the solution 32. The bubbles 32a serve as impediments on the irradiation optical path in the case of irradiation with the second pulse of the pulse laser light and thereafter.

The first pulse is not accompanied by the impediments, which are bubbles 32a. Consequently, the inside of the doping region 31e is irradiated with a uniform optical intensity. On the other hand, in the cases of the second pulse and thereafter, the bubbles 32a serve as impediments. Consequently, in the doping region 31e, the optical intensity becomes ununiform.

Thus, the irradiation only with the first pulse capable of irradiation with the uniform optical intensity in the doping region 31e is not accompanied by the bubbles 32a. Consequently, only this irradiation with the first pulse is sometimes performed. However, according to the method of irradiating the one doping region 31e only with the first pulse, possible occurrence of variation in pulse energy between the pulses with which a plurality of doping regions 31e are respectively irradiated sometimes makes the concentration and depth of the dopant unstable. To stabilize the concentration and depth of the dopant between the plurality of doping regions 31e, it is preferable that each doping region 31e be irradiated with a plurality of pulses.

To solve this problem, the embodiments described below each include a solution supply system 46, a first control unit 47a, and a second control unit 47b. The solution supply system 46 supplies the solution 32 to the doping regions 31e on the irradiation object 31. The first control unit 47a controls the number of pulses with which the identical doping region 31e is to be irradiated, and the fluence of the pulse. The second control unit 47b controls the flow velocity of the solution 32 so as to move the bubbles to occur in the solution 32 from the doping region 31e every time of irradiation with the pulse of the pulse laser light.

3. Laser doping device in first embodiment 3.1 Configuration

Figure 3:
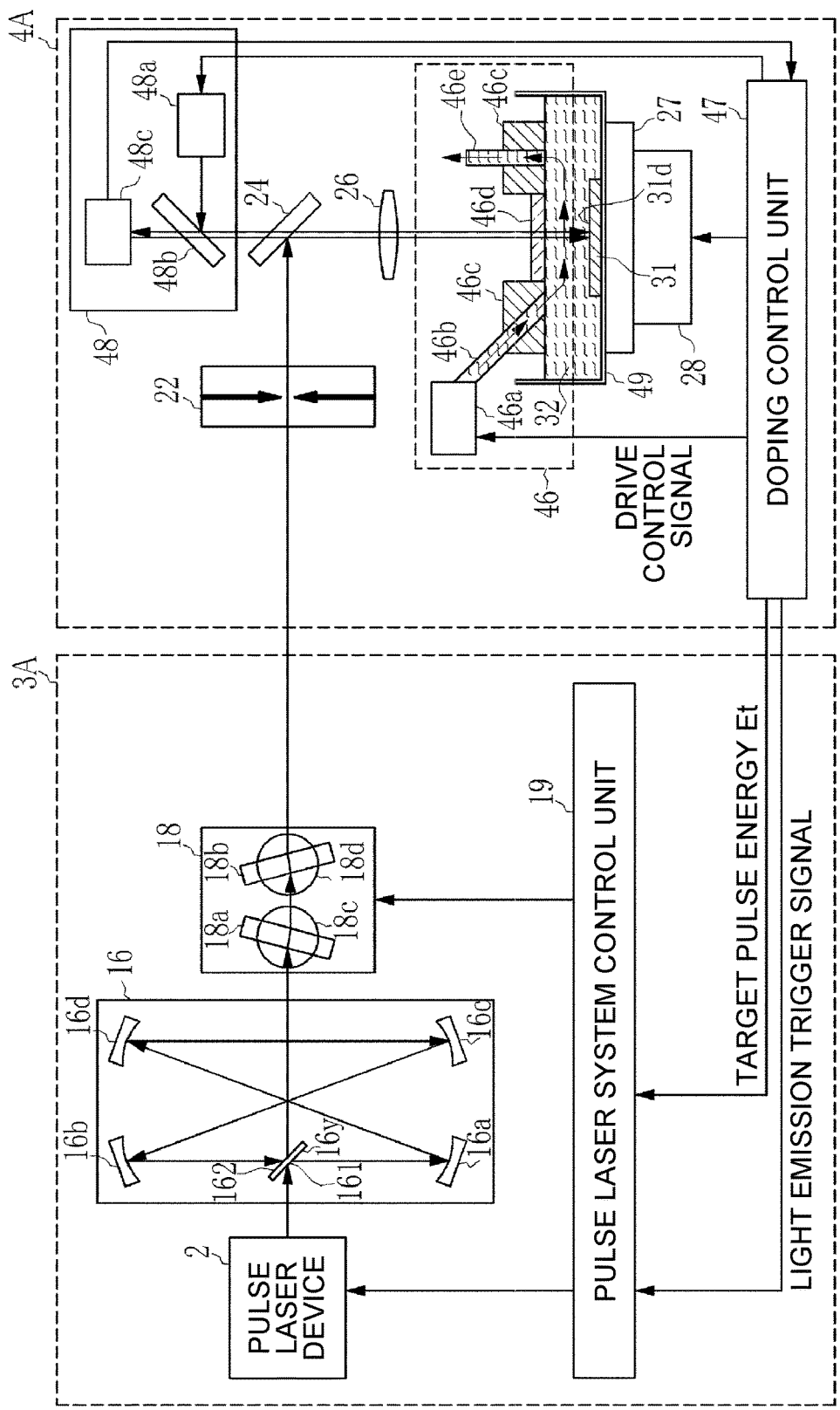
FIG. 3 schematically illustrates a configuration of a laser doping device according to a first embodiment.

FIG. 3 schematically illustrates a configuration of a laser doping device according to a first embodiment. A laser system 3A includes a pulse laser system control unit 19 in addition to the configuration of the laser system 3 described with reference to FIG. 1. In the laser doping device according to the first embodiment, a doping device 4A includes a solution supply system 46 and a doping control unit 47 in addition to the configuration of the doping device 4 described with reference to FIG. 1. The doping device 4A may further include a melting state measurement unit 48.

The solution supply system 46 includes, for example, a solution supply pump 46a, a solution supply pipe 46b, a plate 46c, a window 46d, and a solution discharge pipe 46e. In a case where the solution supply system 46 is used, a vessel 49 that retains the solution 32 to be supplied by the solution supply system 46 is used. The irradiation object 31 is stored on the bottom of the vessel 49 so as to be soaked in solution 32 retained in the vessel 49. The irradiation object 31 is disposed such that the surface to be irradiated with the pulse laser light can be substantially parallel to the liquid surface of the solution 32 in the vessel 49 and be disposed below the liquid surface of the solution 32.

The output of the solution supply pump 46a communicates with the solution supply pipe 46b fixed to the plate 46c. The solution supply pipe 46b is fixed to the plate 46c in a state inclined from the liquid surface such that the solution can flow along the surface of the doping region 31e on the irradiation object 31 to be irradiated with the pulse laser light. The outlet of the solution supply pipe 46b is oriented toward the doping region 31e on the irradiation object 31.

Furthermore, the solution discharge pipe 46e that discharges a part of the solution 32 from the vessel 49 is fixed to the plate 46c. The solution 32 discharged through the solution discharge pipe 46e is purified as required, and subsequently is retained in a tank, not illustrated. The tank may communicate with the input of the solution supply pump 46a.

The window 46d is fixed to the plate 46c, and is disposed on the optical path of the pulse laser light having transmitted through the transfer optical system 26. The material of the window 46d is, for example, synthetic quartz that transmits excimer laser light. The lower surface of the window 46d may be in contact with the solution 32. The solution 32 is prevented from flowing into the upper surface of the window 46d. Accordingly, the window 46d is disposed above the liquid surface of the solution 32. Alternatively, the periphery of the window 46d may be surrounded by the plate 46c while the upper surface of the plate 46c may be disposed above the liquid surface of the solution 32, thus preventing the solution 32 from flowing onto the upper surface of the window 46d.

The melting state measurement unit 48 measures the melting state of the doping region 31e on the irradiation object 31. The melting state measurement unit 48 includes a semiconductor laser device 48a, a half mirror 48b, and an optical sensor 48c. The semiconductor laser device 48a outputs red laser light having a wavelength of 660 nm. The half mirror 48b is a half mirror that transmits about 50% of the red laser light, and reflects about 50% of this light. The half mirror 48b is disposed at a position allowing this mirror to reflect the reflected red laser light toward the highly reflective mirror 24.

The red laser light reflected by the half mirror 48b enters the optical path of the pulse laser light. The highly reflective mirror 24, the transfer optical system 26 and the window 46d, which are disposed on the optical path of the pulse laser light, have optical characteristics that transmit the red laser light. The highly reflective mirror 24 is a dichroic mirror that reflects the pulse laser light and transmits the red laser light. The red laser light reflected by the half mirror 48b transmits through the highly reflective mirror 24, the transfer optical system 26 and the window 46d, and the doping region 31e on the irradiation object 31 in the solution 32 is irradiated with this light.

The optical sensor 48c is disposed at a position of detecting the red laser light having been reflected by the irradiation object 31 and transmitted through the transfer optical system 26, the highly reflective mirror 24 and the half mirror 48b. The optical sensor 48c is, for example, a photodiode having a sensitivity to the red laser light. A bandpass filter having a high transmittance of red laser light with a wavelength of 660 nm may be disposed between the half mirror 48b and the optical sensor 48c.

The pulse laser system control unit 19 controls the pulse laser device 2 on the basis of the target pulse energy Et and the light emission trigger signals, which have been transmitted from the doping control unit 47. The pulse laser system control unit 19 transmits, to the pulse laser device 2, the target pulse energy EL1 of pulse laser light output from the pulse laser device 2. Next, the pulse laser system control unit 19 transmits, to the attenuator 18, a signal for controlling the transmittance T2 of the attenuator 18 such that the target pulse energy Et of the pulse laser light having passed through the attenuator 18 can be a value obtained by the following expression.

$$Et = T1 \times T2 \times EL1$$

Here, T1 is the transmittance of the optical pulse stretcher 16.

The doping control unit 47 adjusts the XYZ stage 28 that supports the vessel 49 such that the doping region 31e on the irradiation object 31 can be disposed at the irradiation position with the pulse laser light having passed through the transfer optical system 26. The doping control unit 47 controls the melting state measurement unit 48. More specifically, for measuring the melting state, the doping control unit 47 transmits, to the semiconductor laser device 48a, a drive signal for starting emission of the red laser light, and receives the reflected light intensity of the red laser light output from the optical sensor 48c.

Figure 4:
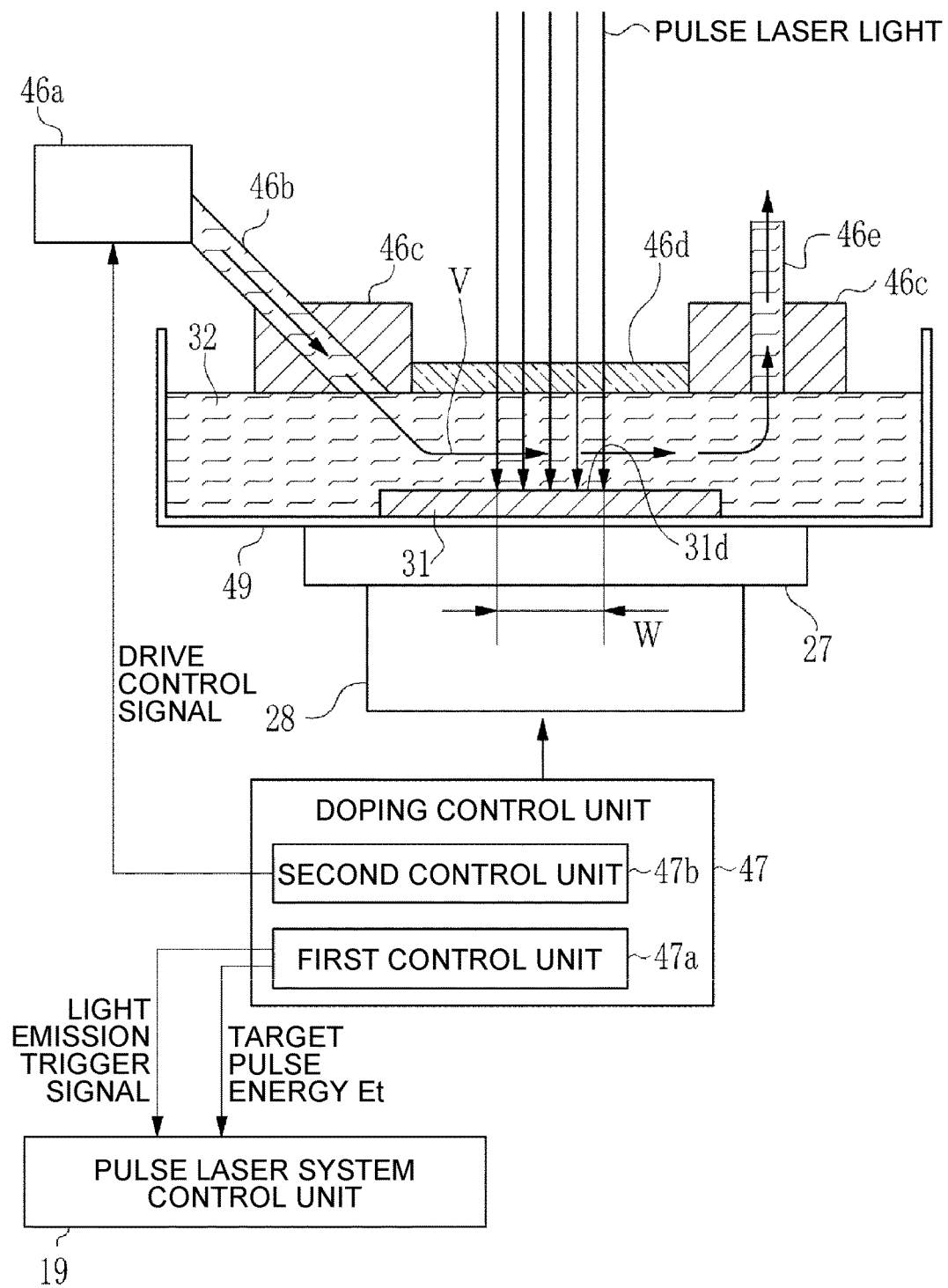
FIG. 4 illustrates a doping control unit of the first embodiment.

As illustrated in FIG. 4, the doping control unit 47 includes the first control unit 47a, and the second control unit 47b. The first control unit 47a transmits, to the pulse laser system control unit 19, data on the target pulse energy Et of the pulse laser light having passed through the attenuator 18 such that the fluence of the pulse laser light in the doping region 31e on the irradiation object 31 can have a predetermined value. Here, the fluence is the energy irradiation density per pulse contained in the pulse laser light.

The first control unit 47a transmits, to the pulse laser system control unit 19, the light emission trigger signals according to the number of pulses. Upon receipt of the light emission trigger signals from the first control unit 47a, the pulse laser system control unit 19 inputs the signal into the pulse laser device 2. Upon receipt of the light emission trigger signals, the pulse laser device 2 outputs the pulse laser light having a pulse energy around the target pulse energy EL1.

The number of pulses is the number of pulses with which the identical doping region 31e is to be irradiated. In a case where one light emission trigger signal corresponds to one pulse, the number of pulses is defined by the number of light emission trigger signals to be transmitted from the first control unit 47a. The repetition frequency is defined by the number of light emission trigger signals transmitted from the first control unit 47a and the transmission intervals between the plurality of light emission trigger signals. The repetition frequency ranges from 1 to 6 kHz, for example.

The second control unit 47b transmits a drive control signal for adjusting the output of the solution supply pump 46a such that the solution 32 can have a predetermined flow velocity. The outlet of the solution supply pipe 46b is oriented toward the doping region 31e on the surface of the irradiation object 31. Consequently, as indicated by arrows in the solution 32 in FIG. 4, the direction in which the solution 32 flows is substantially parallel to the surface of the irradiation object 31.

It is preferable that the second control unit 47b control the flow velocity V of the solution 32 to be in the following range.

$$W \times PF \leq V \leq 20 \, [m/s]$$

Here, W [m] is the beam width of the pulse laser light with which the doping region 31e is irradiated, and is the beam width in the direction in which the solution 32 flows. PF [the number of pulses/s] is the repetition frequency, which is the number of pulses per unit time [s] in the pulse laser light.

That is, only with the flow velocity V of W×PF or higher, even if the bubbles 32a are caused by irradiation with one pulse in the doping region 31e, the bubbles 32a can be moved from the doping region 31e before irradiation with the next pulse. For example, in a case where the pulse laser light has a beam width W=0.001 m and a repetition frequency PF=1 kHz, the flow velocity V reaches a lower limit value Vmin=1 m/s. On the contrary, if the flow velocity V exceeds 20 m/s, occurrence of cavitation in the solution 32 becomes frequent. Consequently, it is preferable that the velocity V be 20 m/s or lower. Accordingly, it is preferable that the upper limit value Vmax of the flow velocity V be 20 m/s.

3.2 Operation

In doping, the irradiation object 31 is stored in the vessel 49 that retains the solution 32. The doping control unit 47 adjusts the XYZ stage 28 such that the doping region 31e on the irradiation object 31 coincides with irradiation position with the pulse laser light. The second control unit 47b transmits the drive control signal to the solution supply pump 46a such that the solution 32 can have the aforementioned flow velocity V indicated as in the preferable range, according to the beam width W and the repetition frequency PF of the pulse laser light. The solution supply pump 46a starts driving on the basis of the drive control signal, and starts to supply the solution 32 from the tank into the vessel 49. Thereby, the flow of the solution 32 occurs in the doping region 31e on the surface of the irradiation object 31 in the vessel 49.

In this state, the first control unit 47a transmits, to the pulse laser system control unit 19, the target pulse energy Et and the light emission trigger signals. The pulse laser system control unit 19 controls the pulse laser device 2 on the basis of the received target pulse energy Et and light emission trigger signals to thereby cause the pulse laser device 2 to emit the pulse laser light. The pulse laser light output from the pulse laser device 2 is pulse-stretched by the optical pulse stretcher 16 and then is attenuated by the attenuator 18, and enters the slit 22.

The pulse laser light having transmitted through the slit 22, in turn, transmits through the highly reflective mirror 24, the transfer optical system 26, the window 46d and the solution 32, and the doping region 31e on the irradiation object 31 is irradiated with this light. The target pulse energy Et defines the fluence per pulse of the pulse laser light in the doping region 31e. The light emission trigger signal defines the number of pulses of the pulse laser light with which the identical doping region 31e is to be irradiated. Accordingly, the doping region 31e is irradiated with the pulse laser light having the predetermined fluence and number of pulses.

As illustrated in FIG. 5A, irradiation of the doping region 31e with the first pulse of the pulse laser light causes the bubbles 32a in the solution 32. However, the solution 32 flows with the flow velocity V. Consequently, the bubbles 32a are moved from the doping region 31e. This movement removes the bubbles 32a from the doping region 31e before irradiation with the next pulse. Accordingly, as illustrated in FIG. 5B, the bubbles 32a do not impede the irradiation optical path of the second pulse of the pulse laser light and thereafter.

The irradiation with the pulse laser light melts the polysilicon film 31d in the doping region 31e, and the dopant in the solution 32 is implanted into the polysilicon film 31d. At the same time, the implanted dopant is activated, and is diffused in the polysilicon film 31d.

When one doping region 31e is irradiated with the pulse laser light containing the number of pulses defined by the light emission trigger signals, the doping control unit 47 adjusts the XYZ stage 28 such that the next doping region 31e coincides with the irradiation position of the pulse laser light. The next doping region 31e is then subsequent to doping with the aforementioned details.

The melting state in the doping region 31e may be measured using the melting state measurement unit 48 during doping. The red laser light output from the semiconductor laser device 48a is reflected by the half mirror 48b and enters the optical path of the pulse laser light, and the doping region 31e on the irradiation object 31 in the solution 32 is irradiated with this light. The red laser light reflected by the doping region 31e transmits through the half mirror 48b and enters the optical sensor 48c.

When the doping region 31e is irradiated with the pulse laser light and the polysilicon film 31d comes into a completely melted state, the reflectance of the red laser light in the doping region 31e increases in comparison with that before irradiation with the pulse laser light. Increase in the amount of reflected light of the red laser light, in turn, increases the reflected light intensity detected by the optical sensor 48c. When the reflected light intensity output from the optical sensor 48c increases in comparison with that before irradiation with the pulse laser light, the doping control unit 47 determines that the polysilicon film 31d in the doping region 31e has come into the completely melted state. In the thus achieved completely melted state, the dopant is implanted and diffused simultaneously in the doping region 31e. The doping control unit 47 can determine that the dopant is implanted and diffused simultaneously, by measuring the melting state through the melting state measurement unit 48.

3.3 Working Effect

As described above, the laser doping device in the first embodiment includes the solution supply system 46, the first control unit 47a and the second control unit 47b, thereby stabilizing the concentration and depth of dopant between the plurality of doping regions 31e. That is, the flow of the solution 32 moves the bubbles 32a having occurred at each pulse, from the doping region 31e. Accordingly, also at the second pulse of the pulse laser light and thereafter, irradiation with a uniform optical intensity in the doping region 31e can be achieved. Furthermore, one doping region 31e is continuously irradiated with a plurality of pulses. Consequently, even if the pulse energies of individual pulses vary, variation in the average value of pulse energies applied to each doping region 31e is suppressed. Accordingly, the concentration and depth of dopant between the doping regions 31e are stabilized.

3.4 Fluence Range Suitable for Doping

Figure 6:
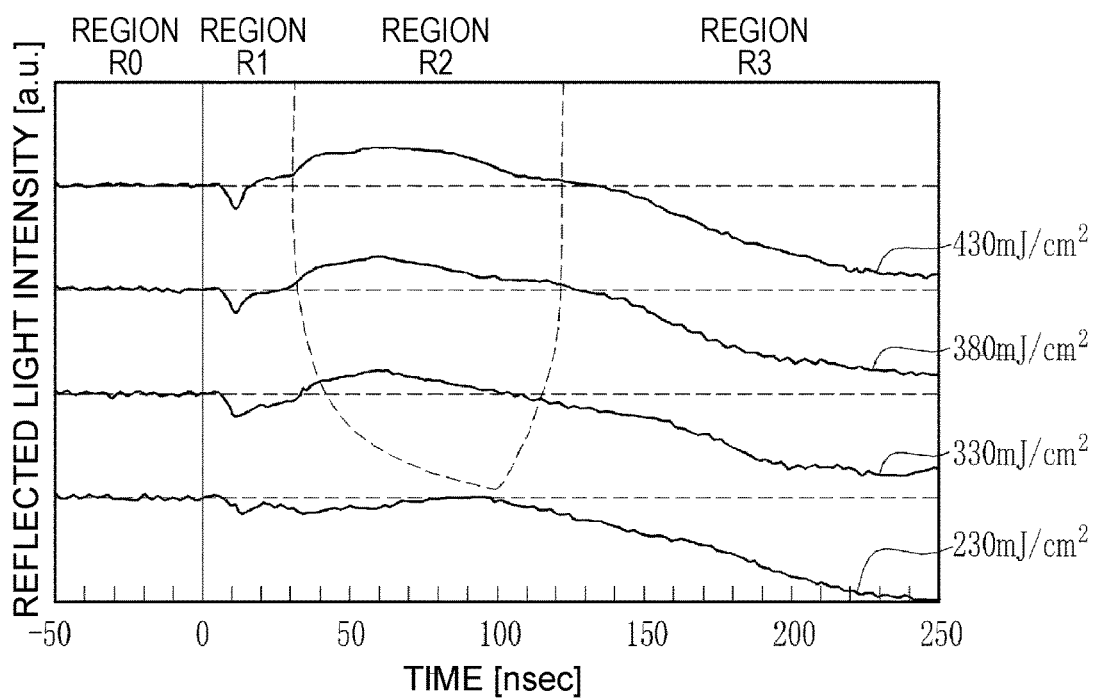
FIG. 6 is a graph illustrating temporal change in the reflected light intensity at a melting state measurement unit in a case where a doping region is irradiated with one pulse of pulse laser light.

FIG. 6 is a graph illustrating the temporal change in the reflected light intensity of the red laser light detected by the optical sensor 48c of the melting state measurement unit 48 in a case where the doping region 31e is irradiated with one pulse of pulse laser light. The reflected light intensity is measured while the fluence of one pulse of pulse laser light in the doping region 31e is changed to four variations, i.e., 230 mJ/cm², 330 mJ/cm², 380 mJ/cm² and 430 mJ/cm². The pulse time width of pulse laser light is about 80 nsec.

In the graph of FIG. 6, a region R0 is a period before irradiation with the pulse laser light. A region R1 is a period immediately after irradiation with one pulse of the pulse laser light, and is a period from 0 nsec. to about 30 nsec. on condition that the irradiation start time point is 0 nsec. A region R2 is a period from about 30 nsec. to about 120 nsec. A region R3 is a period after about 120 nsec.

Typically, in the region R1 immediately after the start of irradiation with the pulse laser light, the polysilicon film 31d comes into a partial melting state. In the thus achieved partial melting state, the red laser light is scattered, and the reflected light intensity decreases in comparison with that in the region R0 before irradiation. Subsequently, the partial melting state transitions to the completely melted state, and the reflected light intensity increases. In the state in the region R3 after irradiation with one pulse, the bubbles 32a occur in the solution 32, and the reflected light intensity decreases.

As can be seen from the graph of FIG. 6, in a case of pulse laser light having a fluence of 230 mJ/cm², the reflected light intensity does not increase in the region R2 after the irradiation, in comparison with that in the region R0 before irradiation. This indicates that the polysilicon film 31d in the doping region 31e is not in the completely melted state. On the contrary, in cases of pulse laser light having fluences of 330 mJ/cm², 380 mJ/cm² and 430 mJ/cm², the reflected light intensity increases in the region R2 after the irradiation, in comparison with that in the region R0 before irradiation. This indicates that the polysilicon film 31d in the doping region 31e is in the completely melted state. Accordingly, to bring the polysilicon film 31d into the completely melted state, it is preferable that the lower limit value of the fluence be 330 mJ/cm² or higher.

Figure 7:
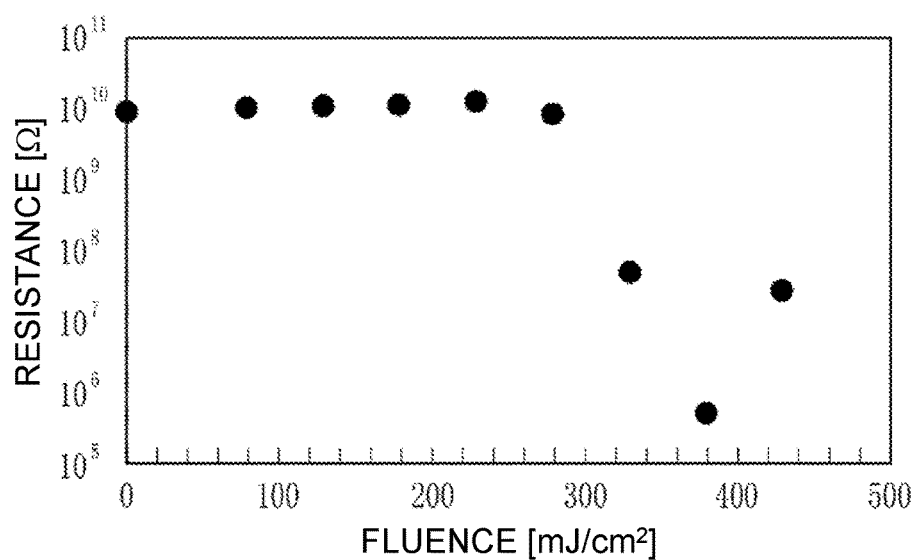
FIG. 7 is a graph illustrating the change in the resistance value that is the electric characteristics of a polysilicon film in a case of doping with the fluence being changed.

FIG. 7 is a graph illustrating the change in the resistance value that is the electric characteristics of the polysilicon film 31d in a case of doping with the fluence being changed. At each fluence, the number of pulses emitted to the identical doping region 31e is 20. As illustrated in FIG. 7, when the fluence becomes about 330 mJ/cm², the resistance value starts to decrease. This indicates that the polysilicon film 31d has come into the completely melted state, and doping implantation and diffusion have advanced. The resistance value decreases to the minimum at the fluence 380 mJ/cm². The resistance value then increases at around 400 mJ/cm². This can be because if the fluence is too high, irradiation with the pulse laser light causes a damage, such as a defect, in the polysilicon film 31d.

Further increase in fluence in turn increases the resistance value, and the resistance value at 430 mJ/cm² is substantially identical to the resistance value at 330 mJ/cm², which is the lower limit value of the fluence. Accordingly, in consideration of increase in resistance value due to the damage, it is preferable that the upper limit value of the fluence be 430 mJ/cm².

Figure 8:
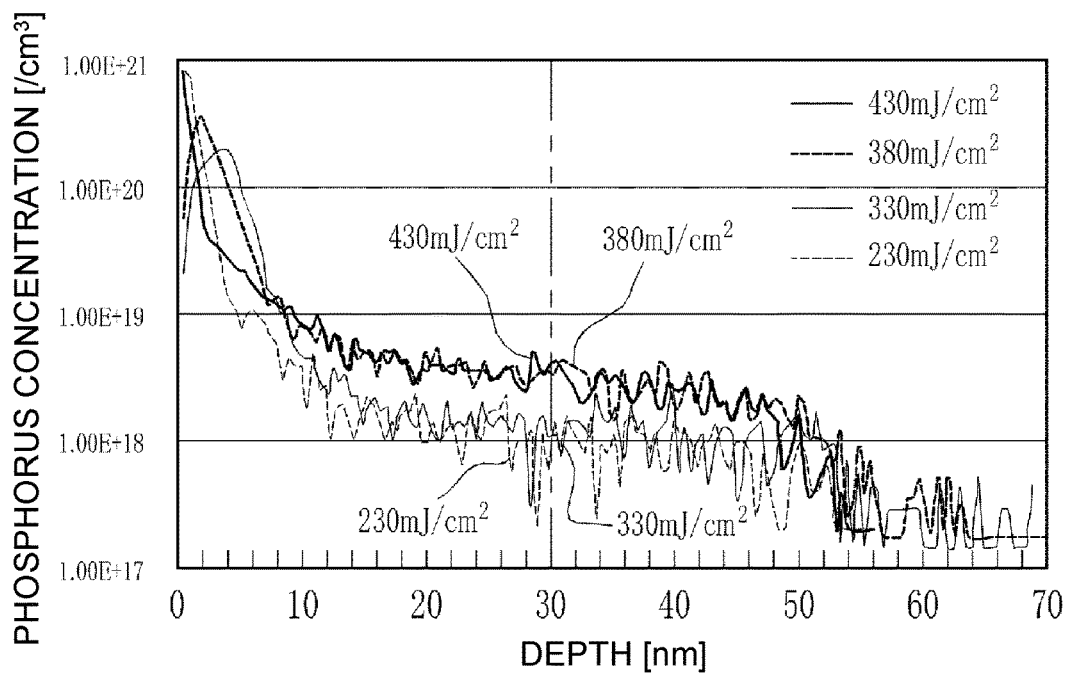
FIG. 8 is a graph illustrating the relationship between the concentration of dopant in the polysilicon film and the doping depth in a case of doping with the pulse laser light at each fluence.
Figure 9:
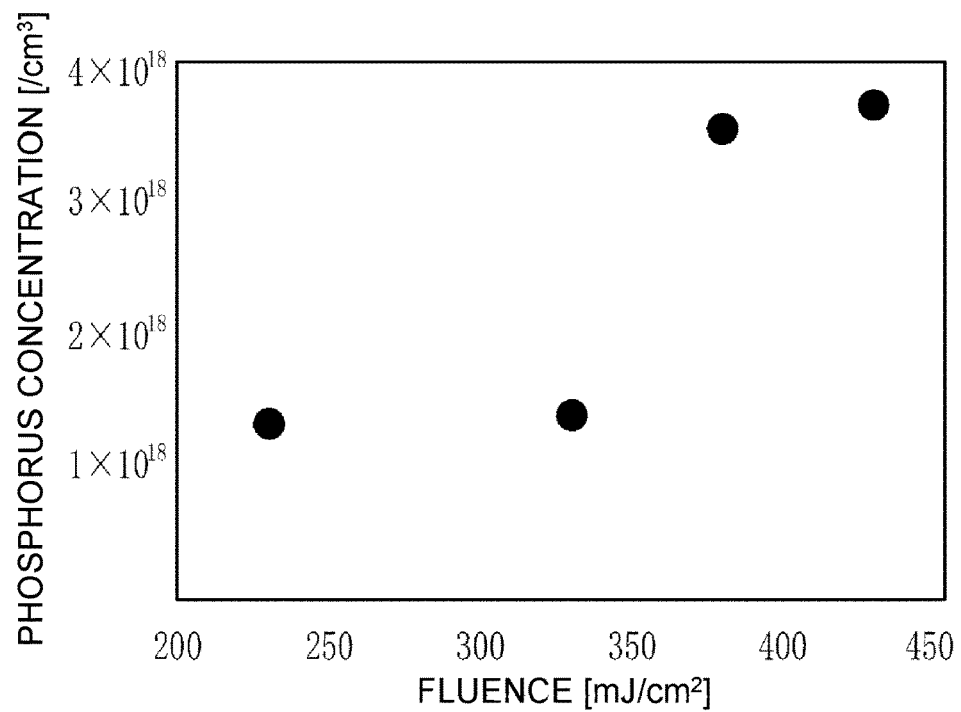
FIG. 9 is a graph illustrating the relationship between the fluence and the dopant concentration with a doping depth of 30 nm.

FIG. 8 is a graph illustrating the relationship between the concentration of dopant in the polysilicon film 31d and the doping depth in a case of doping with the pulse laser light at each fluence. In FIG. 8, the number of pulses of every fluence is 20. FIG. 9 is a graph illustrating the relationship between the fluence and the dopant concentration with a doping depth of 30 nm. FIGS. 8 and 9 are graphs in a case where phosphorus is used as the dopant. The dopant concentration is phosphorus concentration. The phosphorus concentration is measured by secondary ion mass spectrometry (SIMS).

As illustrated in FIG. 7, the resistance value decreases to the minimum at a fluence of 380 mJ/cm². As illustrated in FIGS. 8 and 9, in comparison with the cases of fluences of 230 and 330 mJ/cm², the phosphorus concentration increases in the case of a fluence of 380 mJ/cm². It can be understood that the increase in phosphorus concentration reduces the resistance value.

On the other hand, the case of a fluence of 330 mJ/cm² and the case of a fluence of 230 mJ/cm² are compared with each other. In the case of the fluence of 330 mJ/cm², the phosphorus concentration does not increase in FIGS. 8 and 9 while the resistance value decreases as illustrated in FIG. 7. Accordingly, it can be considered that doping implantation and diffusion simultaneously occur with the fluence of 330 mJ/cm² or higher.

As described above, it is preferable that the range of the fluence FL be 330 mJ/cm²≤FL≤430 mJ/cm², where FL denotes the fluence.

3.5 Range of the Number of Pulses Suitable for Doping

Figure 10:
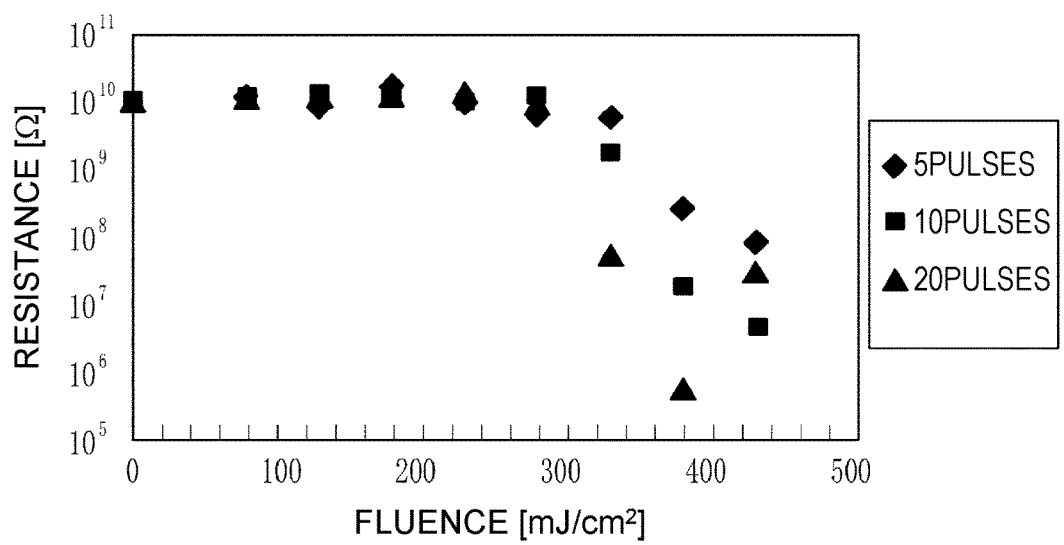
FIG. 10 illustrates what includes a graph with the number of pulses being 20 illustrated in FIG. 7, and additionally includes graphs with the numbers of pulses being 5 and 10.
Figure 11:
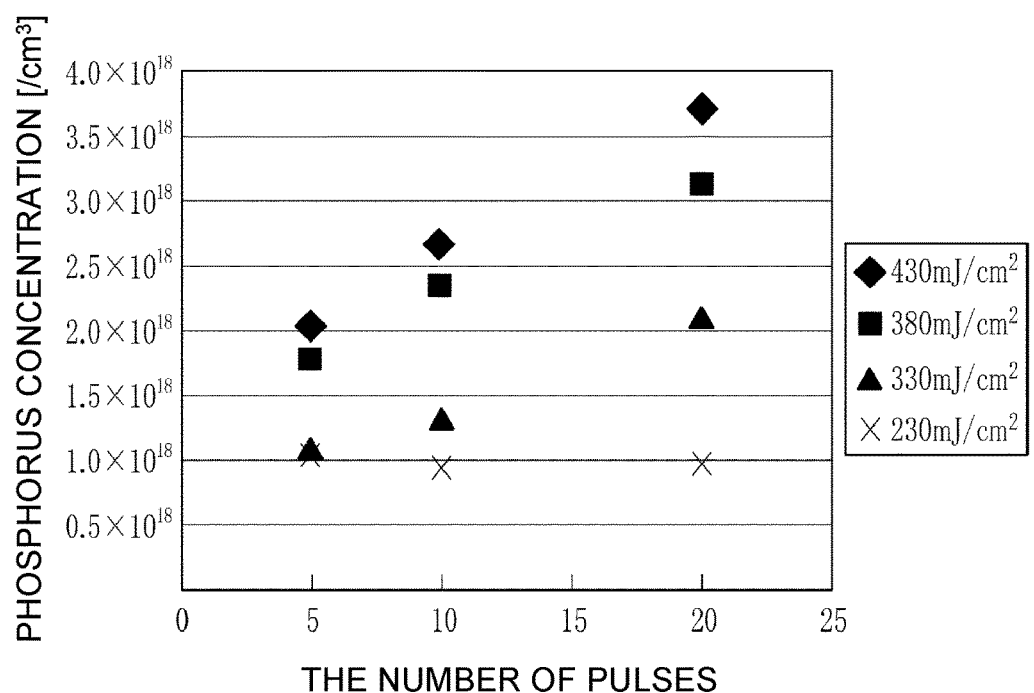
FIG. 11 is a graph of the relationship between the dopant concentration and the number of pulses, the relationship being derived from FIGS. 9 and 10.

FIG. 10 illustrates what includes a graph with the number of pulses being 20 illustrated in FIG. 7, and additionally includes graphs with the numbers of pulses being 5 and 10. FIG. 11 is a graph of the relationship between the dopant concentration and the number of pulses, the relationship being derived from FIGS. 9 and 10. In FIG. 11, the dopant concentration is the phosphorus concentration as illustrated in FIG. 9.

As illustrated in FIG. 10, with the fluence ranging from about 330 mJ/cm² to about 400 mJ/cm², increase in the number of pulses reduces the resistance value. The case where the number of pulses is 10 and the case where the number of pulses is 20 are compared with each other. As illustrated in FIG. 11, at the fluence of 430 mJ/cm², the phosphorus concentration is higher in the case of 20 pulses. However, as illustrated in FIG. 11, the resistance value is higher in the case of 20 pulses than in the case of 10 pulses. This can be because increase in the number of pulses damages the polysilicon film 31d.

As described above, when the number of pulses is defined as N, it is preferable that the range of the number of pulses be 2≤N≤20.

3.6 First Example of Semiconductor Device Manufacturing Method

Figure 12A:
FIGS. 12A to 12G illustrate a first example of a semiconductor device manufacturing method.
Figure 12B:
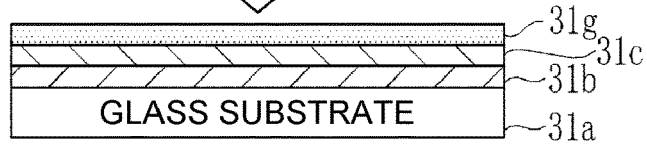
Figure 12C:
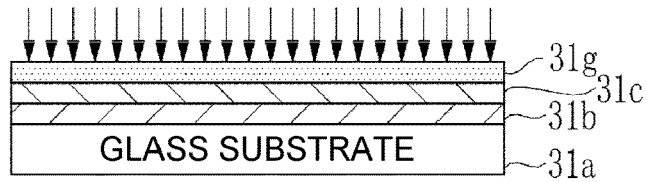
Figure 12D:
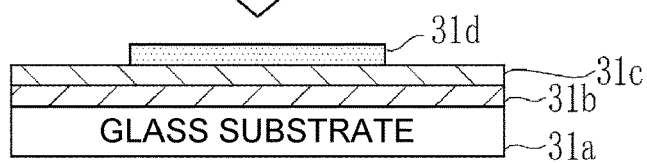
Figure 12E:
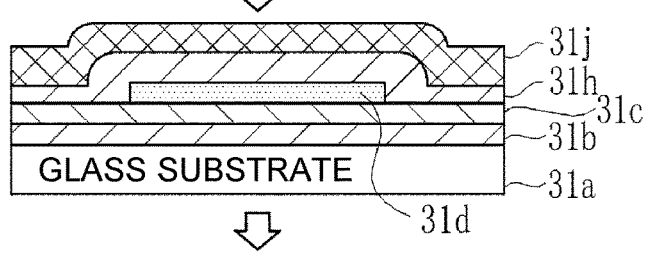
Figure 12F:
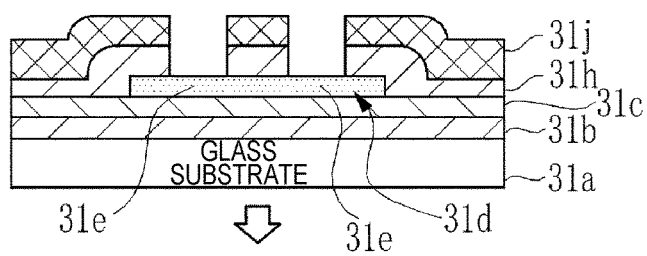
Figure 12G:
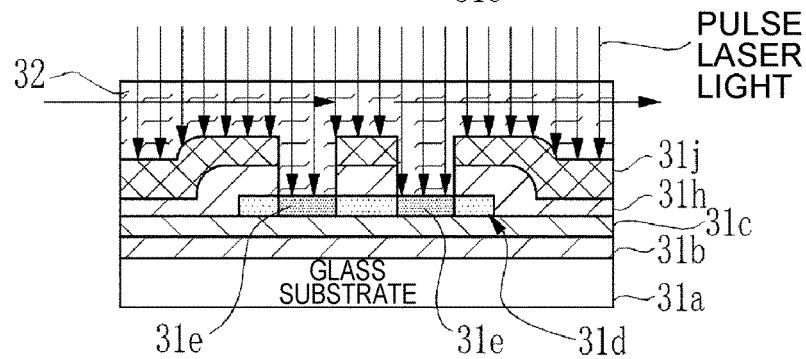

FIGS. 12A to 12G illustrate a first example of a semiconductor device manufacturing method of manufacturing a TFT substrate as the semiconductor device. TFTs formed on the TFT substrate in FIGS. 12A to 12G are of a top-gate type where a gate electrode is disposed on a layer upper than that of a source electrode and a drain electrode. In the semiconductor device manufacturing method illustrated in FIGS. 12A to 12G, a doping step illustrated in FIG. 12G is executed by the laser doping device in the first embodiment.

In a step illustrated in FIG. 12A, the underlaying insulating films 31b and 31c are formed on the glass substrate 31a. In a step illustrated in FIG. 12B, an amorphous silicon film 31g having a thickness of about 100 nm or less is formed on the underlaying insulating films 31b and 31c.

In a step illustrated in FIG. 12C, the laser annealing device irradiates the amorphous silicon film 31g with the pulse laser light for annealing in the ultraviolet range, thus executing the annealing process. The polysilicon film 31d is crystalized by the annealing process, and in a step illustrated in FIG. 12D, the polysilicon film 31d is created. Here, the pulse laser light for annealing is, for example, excimer pulse laser light of ArF, KrF, XeCl or XeF, and has a central wavelength ranging from about 193 nm to about 351 nm.

In a step illustrated in FIG. 12D, the polysilicon film 31d is etched to have the shapes and sizes of channels, source electrodes and drain electrodes of TFTs. The etching is performed, for example, by patterning the polysilicon film 31d in a lithography process and subsequently applying dry-etching. In a step illustrated in FIG. 12E, in a range including the polysilicon film 31d, a gate insulating film 31h and a gate electrode film 31j are formed. The gate insulating film 31h is, for example, $SiO_2$. The gate electrode film 31j is, for example, a multilayer film that contains any or at least one of titanium (Ti), aluminum (Al), molybdenum (Mo) and gold (Au). Here, the step illustrated in FIG. 12E forms the gate insulating film 31h and the gate electrode film 31j, which are one or more films, on the polysilicon film 31d made of a semiconductor. Accordingly, this step corresponds to a first step in the claims according to the semiconductor device manufacturing method.

In a step illustrated in FIG. 12F, the gate insulating film 31h and the gate electrode film 31j are partially removed by etching, and the doping region 31e on the polysilicon film 31d is exposed. The doping regions 31e function as source electrodes and drain electrodes in TFTs. Here, a step illustrated in FIG. 12F partially removes the film formed in the doping region 31e in the region made up of the gate insulating film 31h and the gate electrode film 31j. Accordingly, this step corresponds to a second step in the claims according to the semiconductor device manufacturing method.

The glass substrate 31a after completion of the step in FIG. 12F is set as the irradiation object 31 in the vessel 49 of the laser doping device as illustrated in FIG. 4. In a step illustrated in FIG. 12G, the laser doping device causes the solution 32 to flow to a predetermined region including the doping region 31e in the vessel 49. The step of causing the solution 32 to flow causes the solution 32 including the dopant to flow to the polysilicon film 31d, which is the semiconductor including the doping region 31e. Accordingly, this step corresponds to a third step in the claims according to the semiconductor device manufacturing method.

Furthermore, in the step illustrated in FIG. 12G, the laser doping device irradiates the predetermined region including the doping region 31e with the pulse laser light including a plurality of pulses during execution of the step of causing the solution 32 to flow. Thereby, the doping region 31e is doped. Here, the step illustrated in FIG. 12G corresponds to a fourth step in the claims according to the semiconductor device manufacturing method.

In the step illustrated in FIG. 12G, the region that includes the doping region 31e and is larger than the doping region 31e, is irradiated with the pulse laser light. However, the region other than the doping region 31e is covered by the gate insulating film 31h and the gate electrode film 31j. Consequently, the solution 32 does not come into contact with the covered region. The region that is not in contact with the solution 32 is not doped. Accordingly, even though the region larger than the doping region 31e is irradiated with the pulse laser light, only the doping region 31e can be doped.

The doping regions 31e function as the source electrode and the drain electrode. Consequently, the positional relationship with the gate electrode film 31j is important. According to the manufacturing method illustrated in FIGS. 12A to 12G, as illustrated in FIG. 12G, the gate electrode film 31j itself functions as a mask that defines the region to be in contact with the solution 32, and defines the positional relationship between the gate electrode film 31j and the doping region 31e. That is, self alignment that automatically defines the doping region 31e using the gate electrode film 31j as the mask can be achieved. According to the manufacturing method in this example, the accuracies of the position and size of the doping region 31e can be improved.

The gate electrode film 31j is the metal film. Consequently, this film has a high property of blocking the pulse laser light. An advantageous effect is exerted that blocks the pulse laser light from the polysilicon film 31d other than the doping region 31e. Accordingly, the damage due to irradiation of the region that does not require doping with the pulse laser light can be prevented.

3.7 Second Example of Semiconductor Device Manufacturing Method

Figure 13A:
FIGS. 13A to 13H illustrate a second example of a semiconductor device manufacturing method.
Figure 13B:
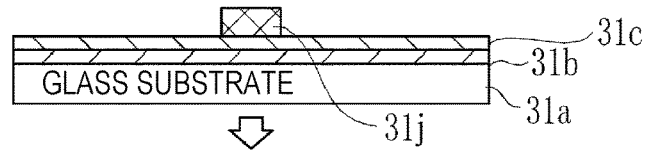
Figure 13C:
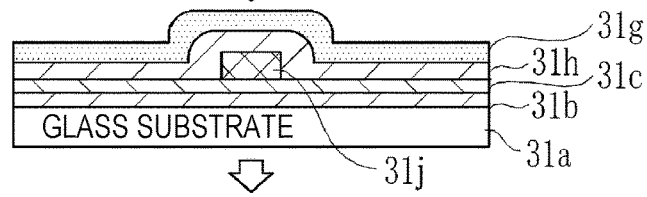
Figure 13D:
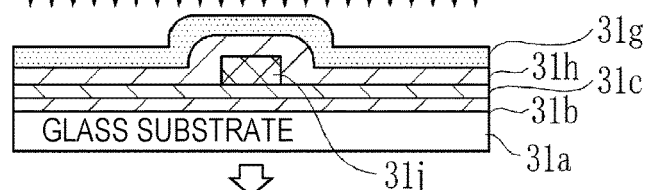
Figure 13E:
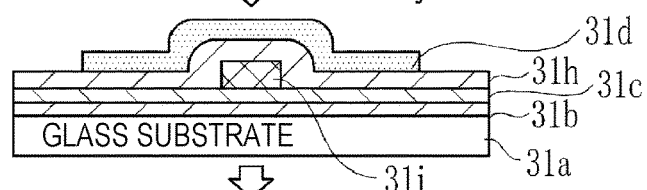
Figure 13F:
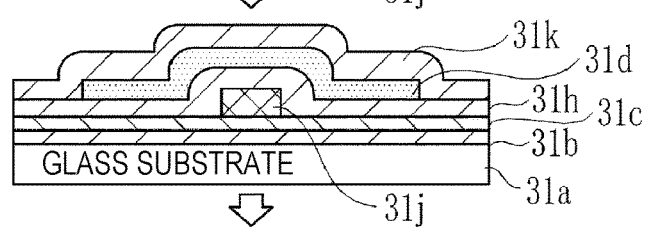
Figure 13G:
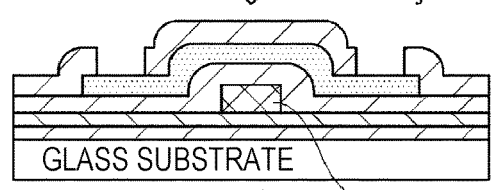
Figure 13H:
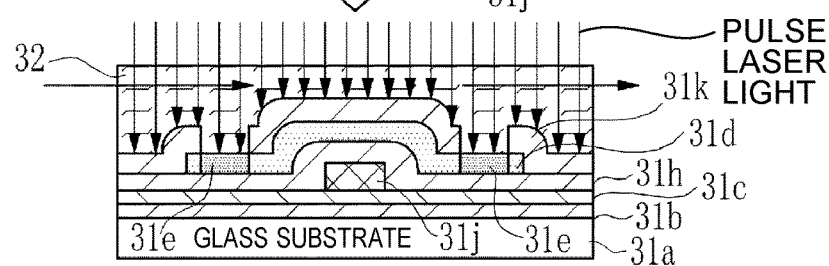

FIGS. 13A to 13H illustrate a second example of a semiconductor device manufacturing method. In the first example, the semiconductor device is the TFT substrate on which the top-gate type TFTs are formed. In the second example, the semiconductor device is a TFT substrate on which bottom-gate type TFTs where the gate electrodes are disposed on a layer lower than that of the source electrodes and the drain electrodes are formed. In the semiconductor device manufacturing method illustrated in FIGS. 13A to 13H, a doping step illustrated in FIG. 13H is executed by the laser doping device in the first embodiment.

The second example is different from the first example in the order of forming the films. The material of the films, the annealing process, and the film forming process, such as etching, are analogous to those in the first example. In the second example, the films identical to those in the first example are denoted by the same symbols. The description of the specific material and the film forming process is omitted.

In a step illustrated in FIG. 13A, the underlaying insulating films 31b and 31c are formed on the glass substrate 31a. The gate electrode film 31j is formed on the underlaying insulating films 31b and 31c. In a step illustrated in FIG. 13B, the gate electrode film 31j is etched to have the shape and size of the gate electrode.

In a step illustrated in FIG. 13C, the gate insulating film 31h is formed, and the amorphous silicon film 31g is formed on the gate insulating film 31h. In a step illustrated in FIG. 13D, the annealing process is applied to the amorphous silicon film 31g, and the polysilicon film 31d is formed. In a step illustrated in FIG. 13E, the polysilicon film 31d is etched as the shape and size of the predetermined region that includes the source electrode and the drain electrode.

In a step illustrated in FIG. 13F, an insulating film 31k is formed on the polysilicon film 31d. The insulating film 31k is, for example, $SiO_2$. Here, the step illustrated in FIG. 13F corresponds to the first step in the claims according to the semiconductor device manufacturing method.

In a step illustrated in FIG. 13G, the insulating film 31k is partially removed by etching, and the doping region 31e on the polysilicon film 31d is exposed. Also as for the bottom-gate type, the doping regions 31e function as source electrodes and drain electrodes. The step illustrated in FIG. 13G corresponds to the second step in the claims according to the semiconductor device manufacturing method.

The glass substrate 31a after completion of the step in FIG. 13G is set in the vessel 49 of the laser doping device. In a step illustrated in FIG. 13H, the laser doping device causes the solution 32 to flow to a predetermined region including the doping region 31e in the vessel 49.

Furthermore, in the step illustrated in FIG. 13H, the laser doping device irradiates the predetermined region including the doping region 31e with the pulse laser light during execution of the step of causing the solution 32 to flow. Thereby, the doping region 31e is doped. The step illustrated in FIG. 13H corresponds to the fourth step in the claims according to the semiconductor device manufacturing method.

3.8 Other

In the aforementioned first embodiment, the description has been made with the example of the glass substrate 31a as the substrate on which the semiconductor is to be formed. Alternatively, instead of the glass substrate 31a, a resin substrate made of a resin may be adopted. The resin substrate is, for example, PET (polyethylene terephthalate), PEN (polyethylene naphthalate), or PI (polyimide).

In the aforementioned first embodiment, the description has been made with the example of polysilicon as the semiconductor. Alternatively, the semiconductor may be a metal oxide semiconductor. The metal oxide semiconductor is, for example, a semiconductor made of indium (In), gallium (Ga), zinc (Zn) and oxygen (O), or a semiconductor made of zinc oxide (ZnO).

4. Laser Doping Device in Second Embodiment 4.1 Configuration

Figure 14:
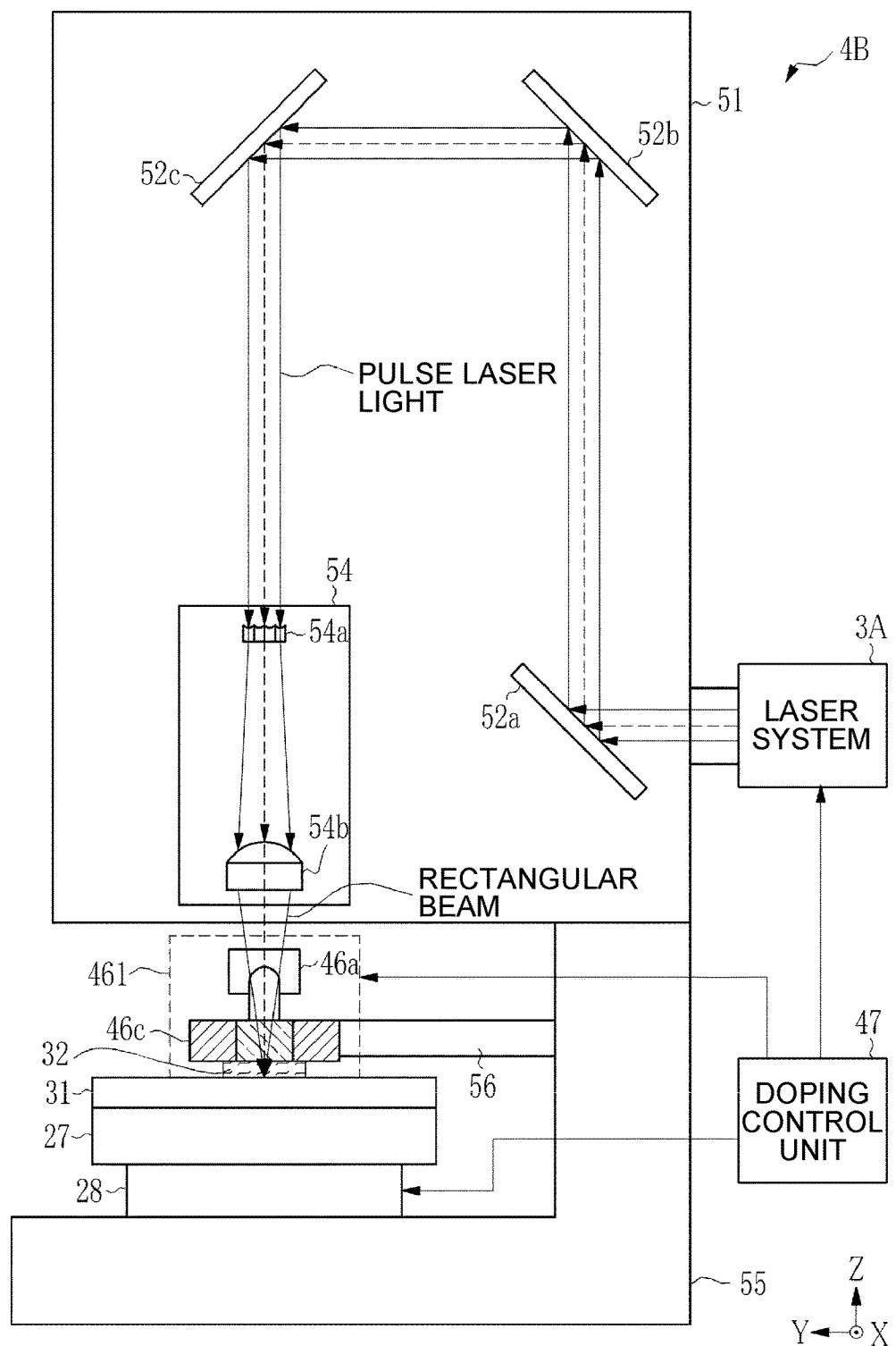
FIG. 14 is a side view illustrating a configuration of a laser doping device according to a second embodiment.
Figure 15:
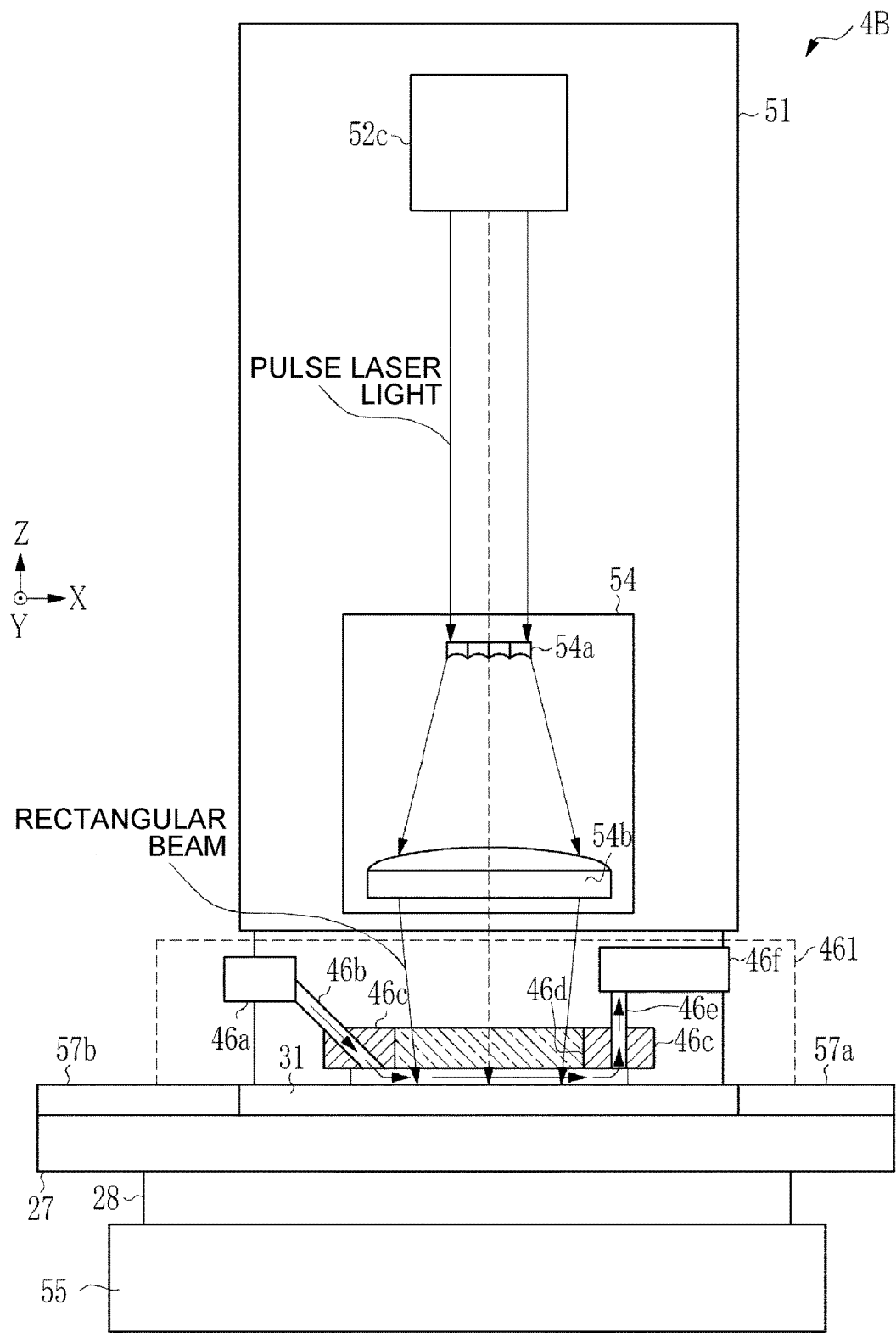
FIG. 15 is a front view illustrating the configuration of the laser doping device according to the second embodiment.

FIGS. 14 and 15 schematically illustrate a configuration of a laser doping device according to a second embodiment. The laser doping device in the second embodiment is different in that this device includes a doping device 4B instead of the doping device 4A in the first embodiment. The laser system 3A is analogous to that in the first embodiment.

The doping device 4B is different from the doping device 4A in that the device 4B includes an optical system 51 that converts the pulse laser light into a rectangular beam. More specifically, the optical system 51 adjusts the pulse laser light such that the sectional shape of this light orthogonal to the optical axis can be rectangular, and guides the adjusted rectangular beam to the predetermined region including the doping region 31e. Hereinafter, the description of the configuration points analogous to those in the first embodiment is omitted. The differences are mainly described. The optical system 51 corresponds to an optical system in the claims of the laser doping device.

FIG. 14 is a configuration diagram of the doping device 4B in a case viewed from a side. FIG. 15 is a configuration diagram of the doping device 4B in a case viewed from a front. On condition that the side direction in FIG. 14 is X axis direction, the front direction in FIG. 15 coincides with Y axis direction.

The optical system 51 includes highly reflective mirrors 52a, 52b and 52c, and a beam homogenizer 54. The highly reflective mirrors 52a, 52b and 52c are disposed so as to reflect the pulse laser light having entered from the laser system 3A and make the light enter the beam homogenizer 54.

The beam homogenizer 54 is disposed on the optical path of the pulse laser light reflected by the highly reflective mirror 52c. The beam homogenizer 54 includes a fly-eye lens 54a and a condenser optical system 54b. The entering pulse laser light is adjusted such that its beam sectional shape can have a rectangular shape elongated in the X axis direction, and outputs the adjusted rectangular beam.

Figure 16:
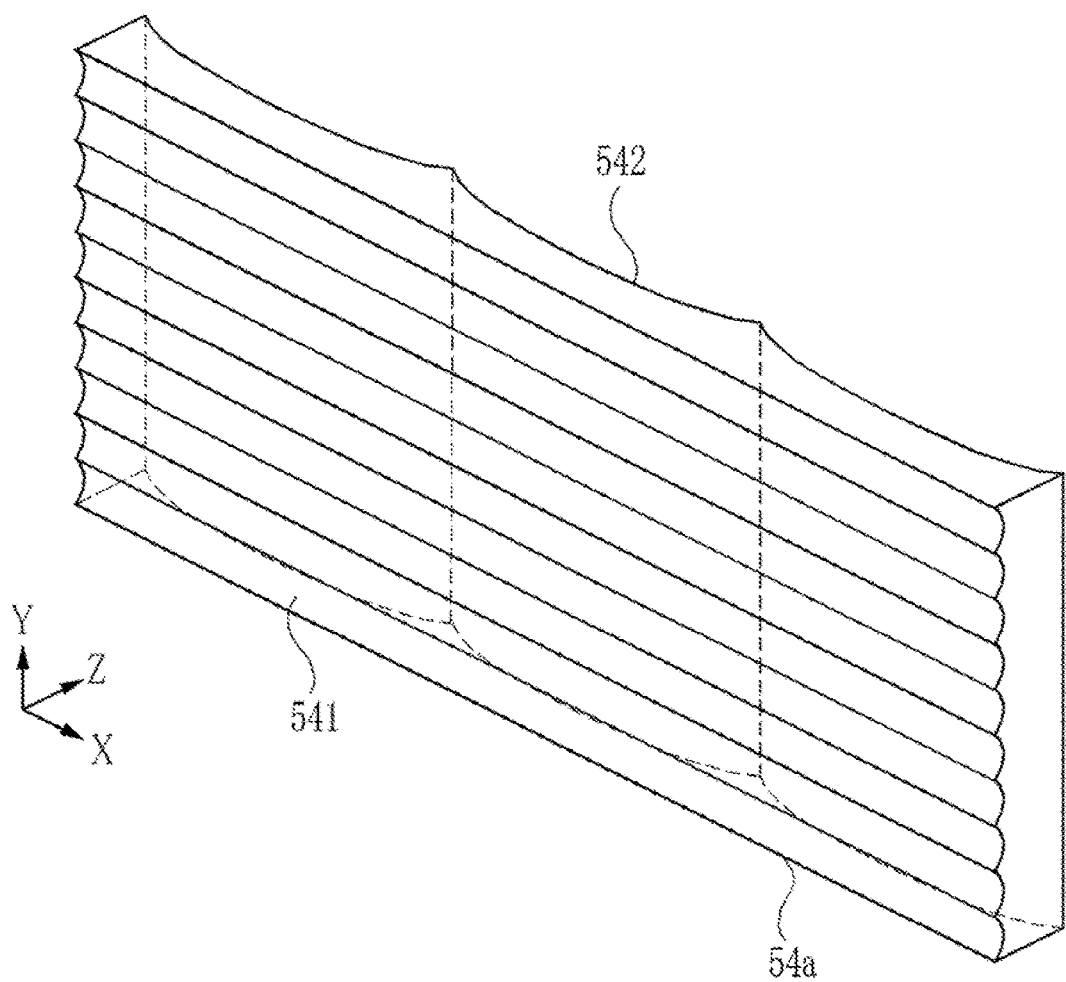
FIG. 16 illustrates a fly-eye lens.

As illustrated in FIG. 16, the fly-eye lens 54a includes a plurality of small lenses arranged in a two-dimensional plane in the X axis direction and the Y axis direction. As for the fly-eye lens 54a, a plurality of cylindrical surfaces 541 made up of concave surfaces are arranged in the Y-direction on the first surface of the substrate that transmits ultraviolet-region light with a high transmittance. A plurality of cylindrical surfaces 542 made up of concave surfaces are arranged in the X-direction on the second surface of the substrate opposite to the first surface. The positions of the front focal planes of the cylindrical surfaces 541 substantially coincide with the positions of the front focal planes of the cylindrical surfaces 542. Each pair of cylindrical surfaces 541 and 542 forms one small lens. The material of the fly-eye lens 54a is, for example, synthetic quartz or $CaF_2$ crystal.

The fly-eye lens 54a is disposed such that the position of the focal plane including the rear foci of the small lenses included in the fly-eye lens 54a can substantially coincide with the position of the front focal plane of the condenser optical system 54b. The Z axis-directional position of the surface of the irradiation object 31 where the doping region 31e is formed is adjusted so as to coincide substantially with the position of the rear focus of the condenser optical system 54b.

Each small lens of the fly-eye lens 54a has a rectangle shape elongated in the X axis direction, and emits a rectangular beam. The fly-eye lens 54a function as a planar light source where a plurality of rectangular beams are arranged on a two-dimensional plane with respect to the condenser optical system 54b. The beams emitted from the respective small lenses of the fly-eye lens 54a are combined with each other at the rear focal plane of the condenser optical system 54b, and are converted into a rectangular beam that has a shape similar to the beam of each small lens but has a larger size.

The pulse laser light having entered the doping device 4B is converted into a rectangular beam by the beam homogenizer 54. The rectangular beam becomes Koehler illumination having a uniform optical intensity distribution in the sectional direction of the beam. The doping region 31e is irradiated with the rectangular beam.

In the solution supply system 461 of the doping device 4B, the window 46d of the plate 46c is formed to have a rectangular shape in a manner analogous to the sectional shape of the rectangular beam. The plate 46c is fixed to a frame 55 via a fixation member 56.

The doping device 4B includes the frame 55. The optical system 51 and the XYZ stage 28 are attached to the frame 55. The irradiation object 31 is an intermediate product for producing a TFT substrate for a large-sized display. In the second embodiment, the irradiation object 31 is large. Accordingly, this embodiment is different from the first embodiment in that the vessel 49 for storing the irradiation object 31 is not provided and the table 27 directly supports the irradiation object 31 without intervention of the vessel 49.

The XYZ stage 28 moves the table 27 in the two-dimensional plane in the X axis direction and the Y axis direction, thus causing the surface of the irradiation object 31 and the window 46d serving as a position irradiated with the rectangular beam to move relatively with each other.

Dummy plates 57a and 57b are disposed on the opposite sides of the irradiation object 31 in the X axis direction. The thicknesses of the dummy plates 57a and 57b are substantially identical to the thickness of the irradiation object 31. The dummy plates 57a and 57b are preliminarily disposed on the table 27.

Figure 17:
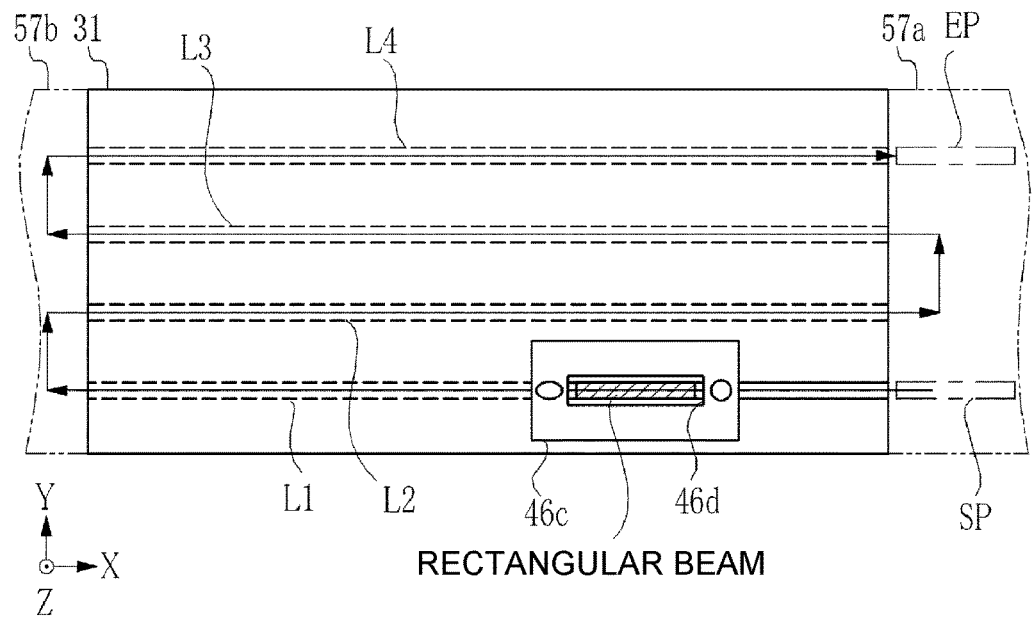
FIG. 17 is a diagram illustrating a doping process of an irradiation object in the second embodiment.

As illustrated in FIG. 17, the irradiation object 31 has, for example, linear doping lines L1 to L4 extending in the X axis direction. The doping lines L1 to L4 define the predetermined region including the doping region 31e. In this example, the description uses the example where the number of doping lines L1 to L4 is four. It is a matter of course that the number of lines may be four or more.

Figure 18:
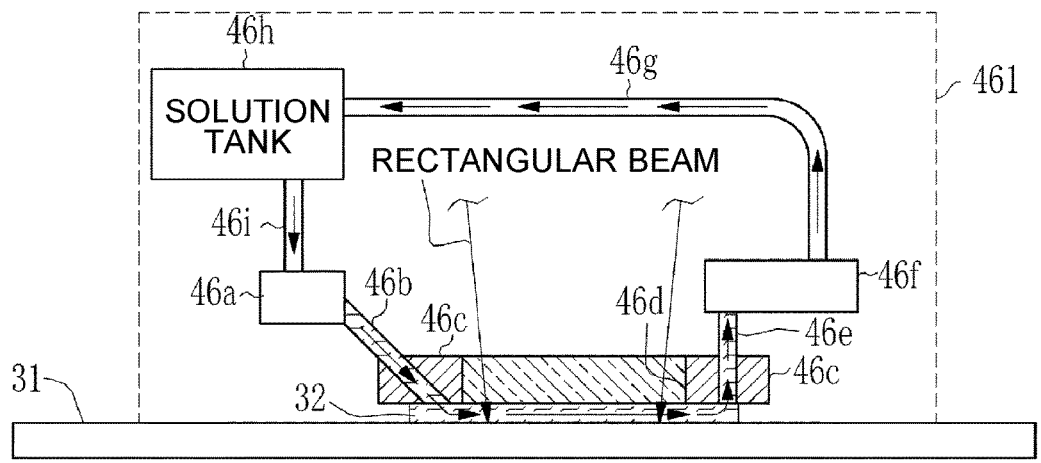
FIG. 18 illustrates a solution supply system of the second embodiment.

As illustrated in FIG. 18, the solution supply system 461 includes not only the configuration of the solution supply system 46 in the first embodiment but also a solution discharge pump 46f, a solution circulation pipe 46g and a solution tank 46h. The solution discharge pump 46f communicates with the outlet of the solution discharge pipe 46e. The output of the solution discharge pump 46f communicates with the solution tank 46h via the solution circulation pipe 46g. The solution tank 46h communicates with the input of the solution supply pump 46a via a pipe 46i.

The solution supply system 461 collects the solution 32 supplied to the doping region 31e, through the solution discharge pump 46f. The solution discharge pump 46f sends the solution 32 discharged from the solution discharge pipe 46e to the solution tank 46h through the solution circulation pipe 46g. The solution 32 collected by the solution tank 46h is sent by the solution supply pump 46a and is supplied to the doping region 31e. Thereby, the solution 32 is used in a circulated manner.

4.2 Operation

For doping, the irradiation object 31 is set on the table 27 between the dummy plates 57a and 57b. The doping control unit 47 controls the XYZ stage 28 to position the irradiation object 31 in the X axis direction and the Y axis direction so as to dispose the window 46d of the plate 46c at a start position SP. The start position SP is on a line extended from the doping line L1 of the irradiation object 31 on the outer dummy plate 57a. Furthermore, the doping control unit 47 adjusts the XYZ stage 28 to perform positioning in the Z axis direction such that when the irradiation object 31 faces the window 46d, the focal plane of the rectangular beam emitted from the beam homogenizer 54 can substantially coincide with the position of the doping region 31e.

The second control unit 47b drives the solution supply system 46 such that the solution 32 flowing on the doping region 31e can have the aforementioned flow velocity V indicated as in the preferable range, according to the beam width W and the repetition frequency PF of the rectangular beam. In this state, the first control unit 47a transmits, to the pulse laser system control unit 19, the target pulse energy Et and the light emission trigger signals. The light emission trigger signals are transmitted at a predetermined repetition frequency. Thereby, the pulse laser device 2 outputs the pulse laser light including a plurality of pulses at the predetermined repetition frequency. The pulse laser light is converted into the rectangular beam by the optical system 51. At the time of start of irradiation with the pulse laser light, the window 46d is at the start position SP, and faces the dummy plate 57a. Accordingly, the dummy plate 57a is irradiated with the pulse laser light.

As illustrated in FIG. 17, the doping control unit 47 transmits, to the XYZ stage 28, a signal for moving the XYZ stage 28 in the X axis direction at a predetermined velocity. As a result, the XYZ stage 28 is accelerated to move in the X axis direction, and achieves the predetermined velocity at a time when the window 56d enters the irradiation object 31. Subsequently, the XYZ stage 28 performs a linear uniform motion at the predetermined velocity while moving the irradiation object 31 in the line direction toward the doping line L1.

Thereby, the window 46d moves at a constant velocity relatively to the doping line L1 on the irradiation object 31. By relative movement at the constant velocity in the X axis direction between the irradiation object 31 and the window 46d, the entire range of doping line L1 is irradiated with the pulse laser light including a predetermined number of pluses. As a result, doping is performed on the doping line L1. Here, the movement velocity of the XYZ stage 28 is determined such that the identical doping region 31e is irradiated with the rectangular beam including the predetermined number of pulses. The operation of the beam homogenizer 54 makes the irradiation region with the rectangular beam have a uniform optical intensity. Accordingly, the entire range of the doping line L1 is irradiated with the rectangular beam at the uniform optical intensity.

After completion of doping over the doping line L1, the entire range over the doping line L1 has passed over the window 46d. Accordingly, the window 46d faces the dummy plate 57b. Although the irradiation with the rectangular beam is continued even at this stage, this irradiation is on the dummy plate 57b. Next, the doping control unit 47 moves the XYZ stage 28 in the Y axis direction, and adjusts the position of the window 46d to the position of the doping line L2. In this stage, the doping control unit 47 performs doping over the doping line L2 while relatively moving the XYZ stage 28 in the direction opposite to that in the case of the doping line L1. Such procedures perform doping also over the doping lines L3 and L4. After the window 46d reaches an end position EP on the dummy plate 57a on the line extended from the last doping line L4, the doping of the one irradiation object 31 is completed.

4.3 Working Effect

The doping device 4B in the second embodiment can perform doping while relatively moving the irradiation object 31 with respect to the window 46d. Consequently, this device is suitable for doping of a large TFT substrate for a large-sized display.

Only the doping lines L1 to L4 required to be subjected to doping on the surface of the irradiation object 31 are irradiated with the pulse laser light. Consequently, the use efficiency of the pulse laser light is high. Accordingly, even the pulse laser device having a low pulse energy can secure a required fluence. According to the working effect of the beam homogenizer 54, the optical intensity on the irradiation region with the rectangular beam is uniform. In addition, by adjustment of the movement velocity of the irradiation object 31, the entire region on the doping lines L1 to L4 is irradiated with the rectangular beam including the predetermined number of pulses. Accordingly, over the entire range on the doping lines L1 to L4, the concentration and depth of doping are stable.

4.4 Other

In the second embodiment, the description has been made using the example where the solution supply system 461 includes the solution discharge pump 46f in addition to the solution supply pump 46a. Alternatively, in a case where the solution 32 is circulated, the circulation may be achieved only by the solution supply pump 46a.

In the second embodiment, the shape of each rectangular beam of the fly-eye lens 54a has been described as the rectangular shape elongated in the X axis direction. Alternatively, this shape may be a square, or a rectangular shape elongated in the Y axis direction. Further alternatively, this shape may be a belt shape that is a shape more similar to a line. The shape of the rectangular beam is appropriately determined in conformity with the shape and the like of the doping region 31e. The shape of the rectangular beam can be changed by changing the shape of the fly-eye lens 54a.

As for the fly-eye lens 54a in this example, the cylindrical surfaces are formed on the first surface and the second surface of one substrate. Alternatively, a fly-eye lens made by combining two substrates each having a cylindrical surface on one surface may be adopted. Each cylindrical surface is not necessarily the concave surface. Alternatively, this surface may be a convex surface. Further alternatively, a Fresnel lens that has the same function as the cylindrical surface may be formed on the substrate.

5. Laser Doping Device in Third Embodiment
5.1 Configuration

Figure 19:
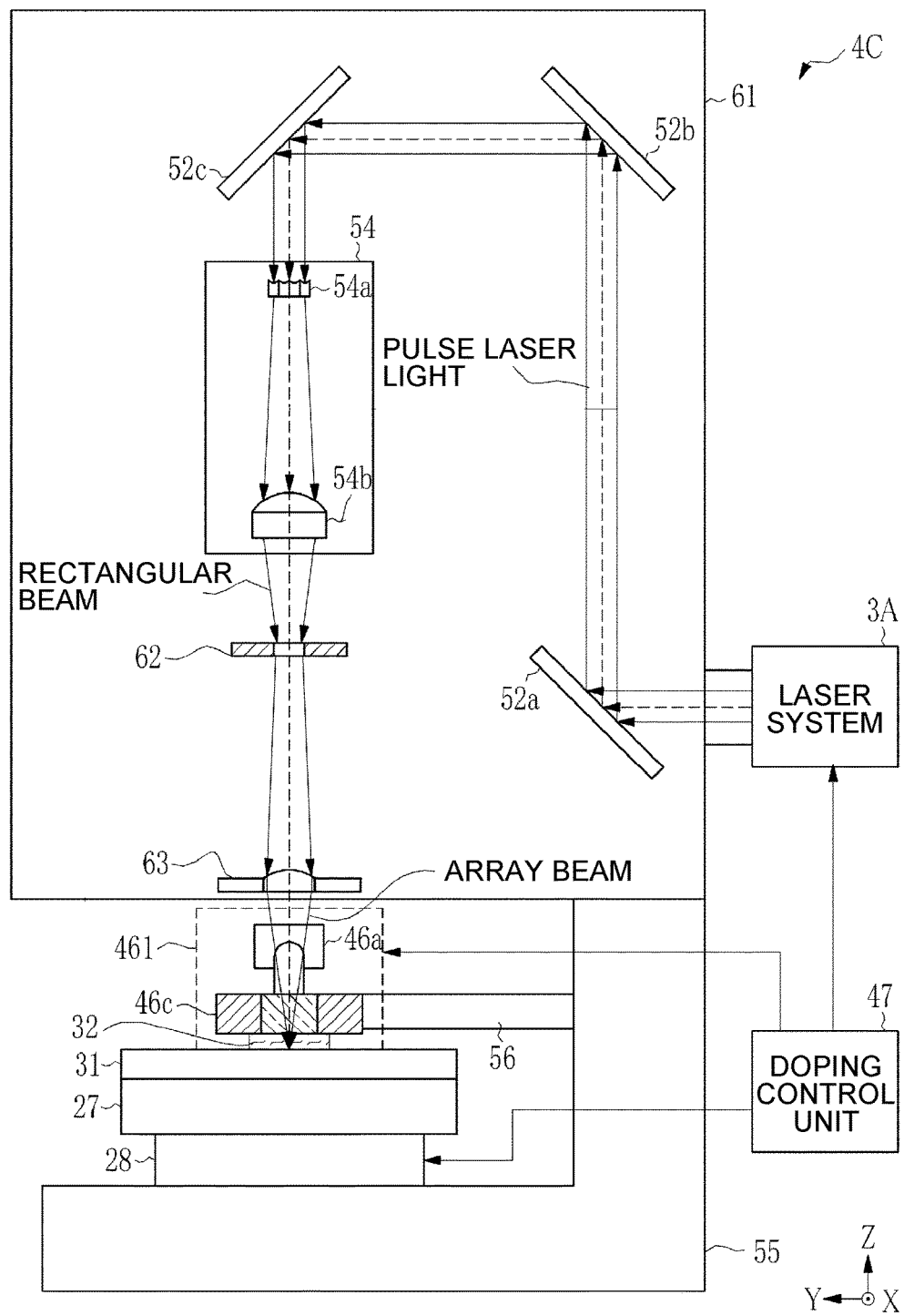
FIG. 19 is a side view illustrating a configuration of a laser doping device according to a third embodiment.
Figure 20:
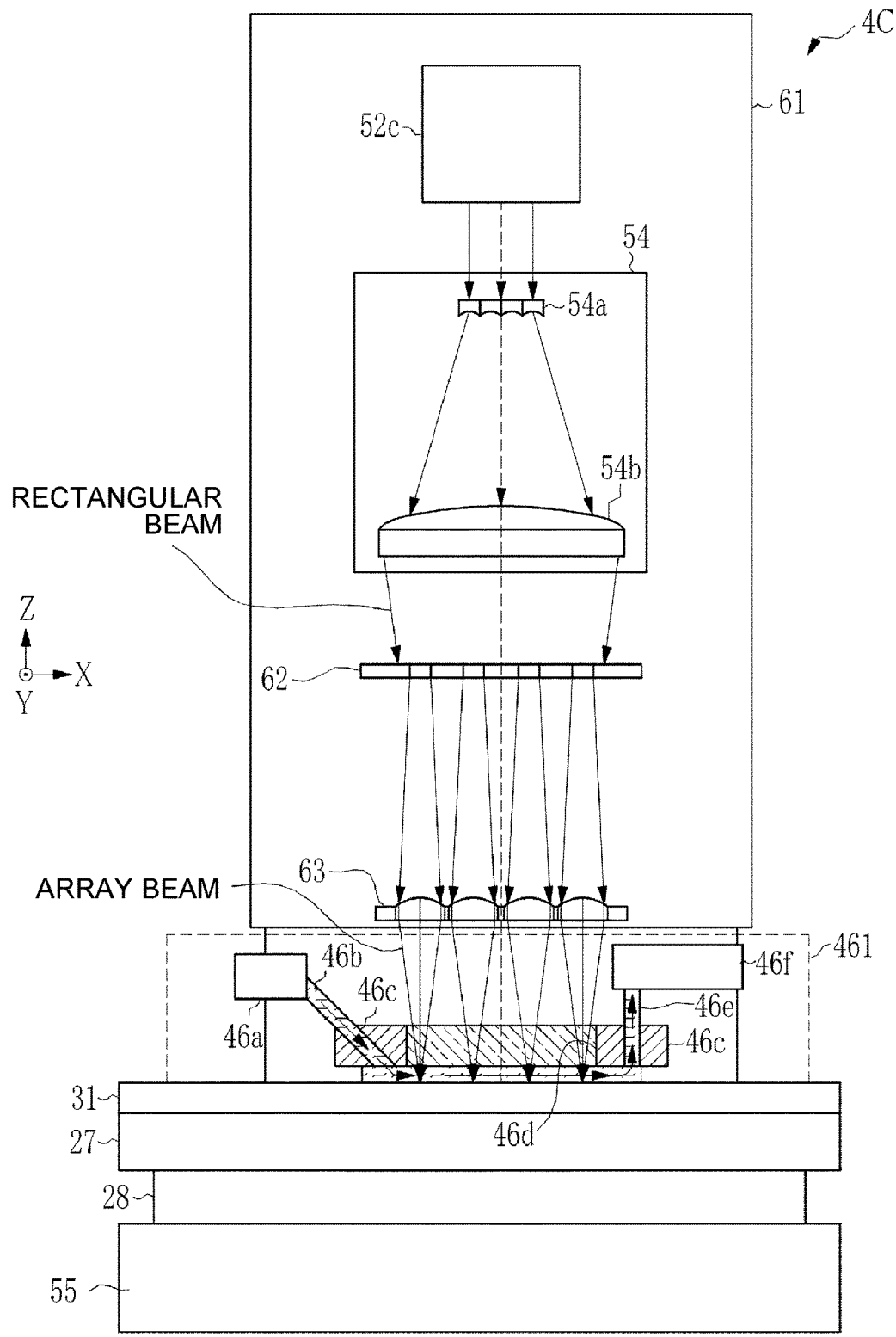
FIG. 20 is a front view illustrating the configuration of the laser doping device according to the third embodiment.

FIGS. 19 and 20 schematically illustrate a configuration of a laser doping device according to a third embodiment. The laser doping device in the third embodiment is different in that this device includes a doping device 4C instead of the doping device 4B in the second embodiment. The laser system 3A is analogous to that in the first and second embodiments. FIG. 19 is the configuration diagram of the doping device 4C in a case viewed from a side.

The doping device 4C is different in that this device includes an optical system 61 in the third embodiment instead of the optical system 51 in the second embodiment. The optical system 51 in the second embodiment converts the pulse laser light into the rectangular beam. Meanwhile, the optical system 61 in the third embodiment converts the pulse laser light into an array beam where a plurality of spot light beams are arranged. The optical system 61 guides the converted array beam to the doping region 31e. The optical system 61 corresponds to an optical system in the claims.

The optical system 61 includes not only the highly reflective mirrors 52a to 52c and the beam homogenizer 54 but also a mask 62 and a multi-lens array 63. The mask 62 and the multi-lens array 63 are disposed on the optical path between the beam homogenizer 54 and the plate 46c having the window 46d.

The rectangular beam emitted from the beam homogenizer 54 enters the mask 62. The mask 62 is a plate which is formed of a material having a light blocking property against the pulse laser light and in which a plurality of openings are one-dimensionally arranged. The mask 62 divides the incident rectangular beam into a plurality of spot beams each having a smaller section than the rectangular beam through the plurality of openings. The number of openings of the mask 62 is, for example, four. In this case, the single rectangular beam entering the mask 62 is divided into four spot beams in conformity with the shape and size of each opening.

In the multi-lens array 63, the plurality of small lenses that condense the spot beams having transmitted through the mask 62 are arranged. The plurality of small lenses function as transfer lenses that transfer a plurality of opening images of the mask 62 corresponding to the respective spot beams onto the irradiation object 31. The plurality of transfer lenses are arranged one-dimensionally in conformity with the arrangement direction of the openings of the mask 62. The multi-lens array 63 guides the array beam where the spot beams are arranged to the doping region 31e on the irradiation object 31 by causing the transfer lenses to transfer the respective opening images of the mask 62 onto the irradiation object 31. The adjustment of the XYZ stage 28 adjusts the position of the irradiation object 31 in the Z axis direction such that the doping region 31e can be disposed on the imaging surfaces of the opening images of the multi-lens array 63. Here, it is preferable that the multi-lens array 63 have a configuration of transferring the opening images of the mask 62 in a reduced manner.

5.2 Operation

Figure 21:
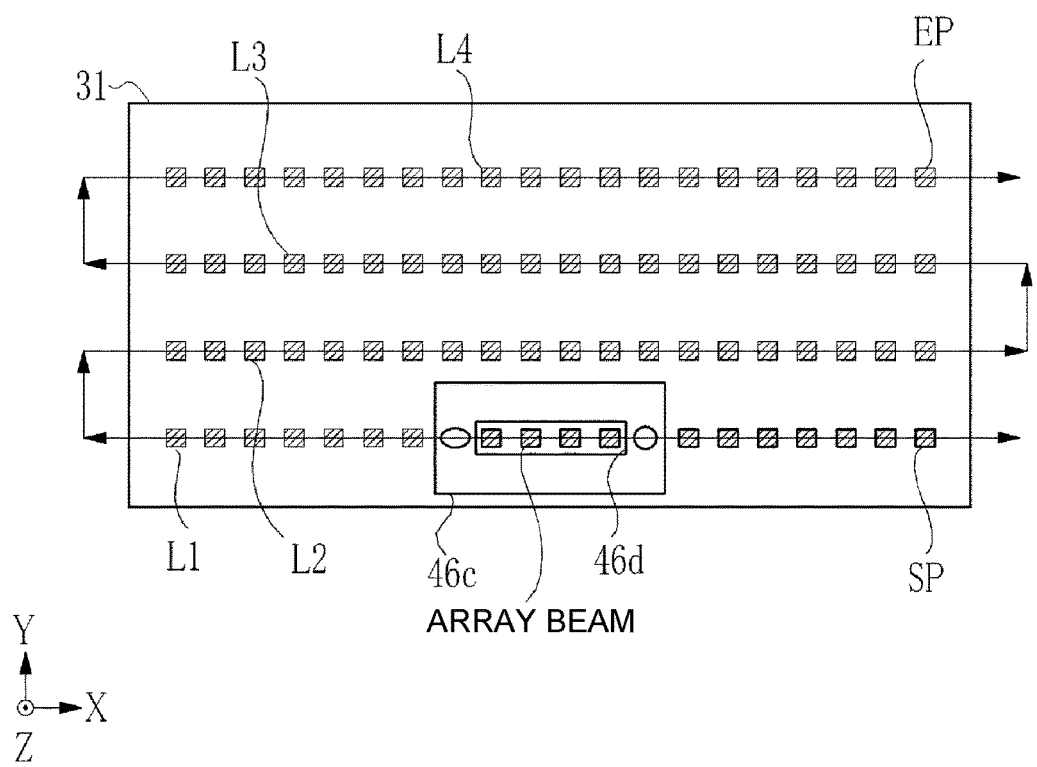
FIG. 21 is a diagram illustrating a doping process in the third embodiment.

As illustrated in FIG. 21, in the third embodiment, the doping control unit 47 performs doping over the doping lines L1 to L4 while relatively moving the irradiation object 31 with respect to the window 46d in a step and repeat method.

That is, for example, in a case of the doping line L1, the doping control unit 47, first, positions the irradiation object 31 in the X axis direction by moving the XYZ stage 28 such that the transferred positions of the four spot beams included in the array beam coincides with the four TFT formation positions on the doping line L1. After completion of the positioning, the doping control unit 47 transmits the light emission trigger signals including the predetermined number of pulses at the predetermined repetition frequency PF to the laser system 3A in a state where the irradiation object 31 is stopped, and causes this system to emit the pulse laser light according to the target pulse energy Et. The pulse laser light is converted by the optical system 61 into the array beam, and the positioned four TFT formation positions are irradiated with the four spot beams included in the array beam at the predetermined number of pulses and the predetermined fluence.

Next, the doping control unit 47 moves the XYZ stage 28 again, and positions the irradiation object 31 in the X axis direction such that the transferred positions of the four spot beams coincides with the next four TFT formation positions. After completion of the positioning, the doping control unit 47 irradiates the next four TFT formation positions with the four spot beams by repeating the aforementioned procedures. Such procedures are repeated to perform doping also over the doping lines L1 to L4. In the third embodiment, the pulse laser light is the array beam. Consequently, this embodiment is different from the second embodiment in that the doping lines L1 to L4 are irradiated with the plurality of spot beams in a state with predetermined intervals being secured.

5.3 Working Effect

The third embodiment exerts the advantageous effect of stabilizing the concentration and depth of doping; this effect is analogous to that in the second embodiment. Furthermore, in the third embodiment, the doping lines L1 to L4 are irradiated with the array beam. Accordingly, in comparison with the second embodiment that emits the rectangular beam, the irradiation region with the pulse beam can be limited to the region that requires doping. More specifically, in the case of transfer in the reduced manner, the use efficiency of the pulse laser light is further improved. Furthermore, in comparison with the case without use of the multi-lens array 63, the condensing operation of the multi-lens array 63 can improve the fluences of the spot beams.

6. Laser Doping Device in Fourth Embodiment
6.1 Configuration

Figure 22:
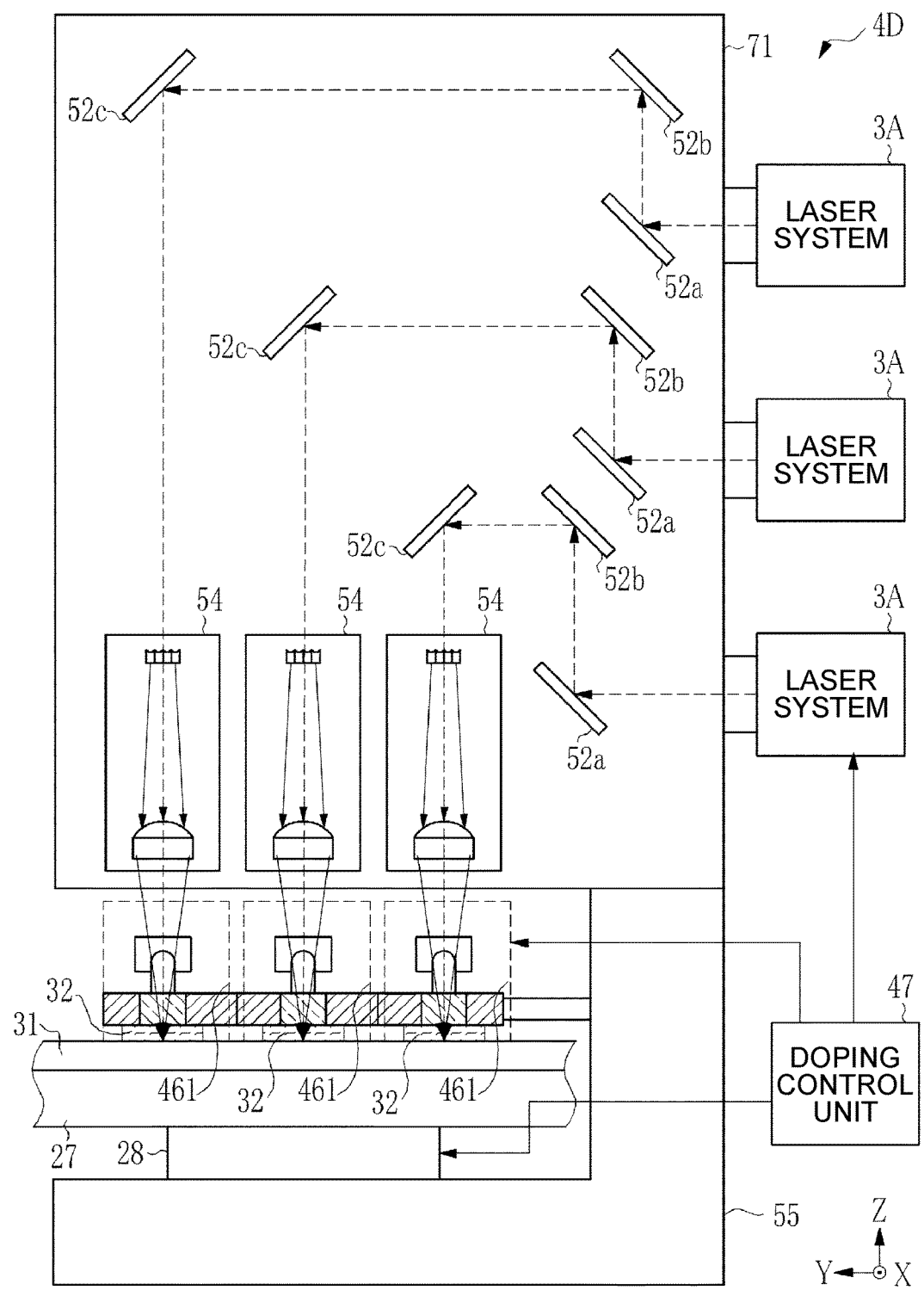
FIG. 22 is a side view illustrating a configuration of a laser doping device according to a fourth embodiment.
Figure 23:
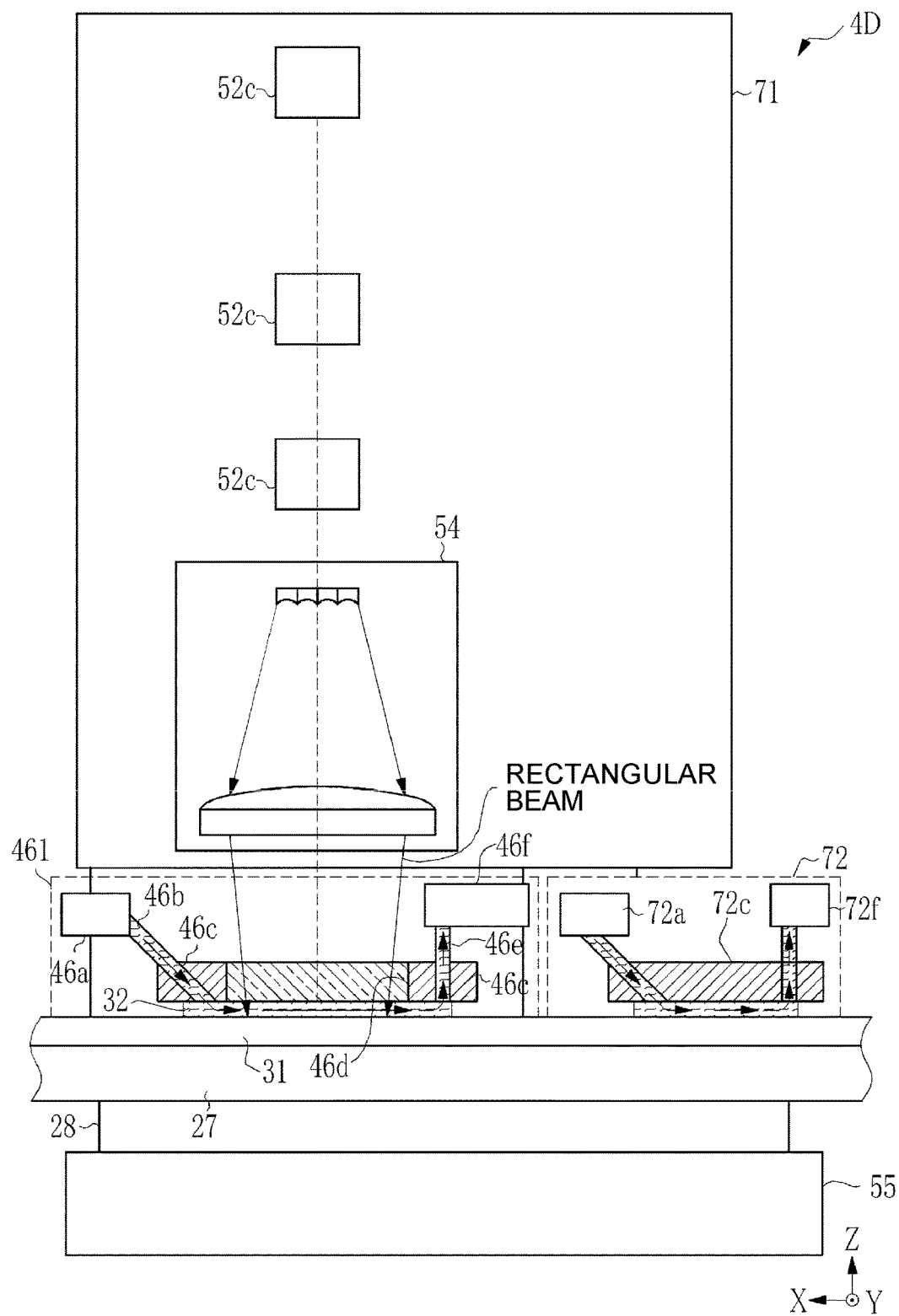
FIG. 23 is a front view illustrating the configuration of the laser doping device according to the fourth embodiment.
Figure 24:
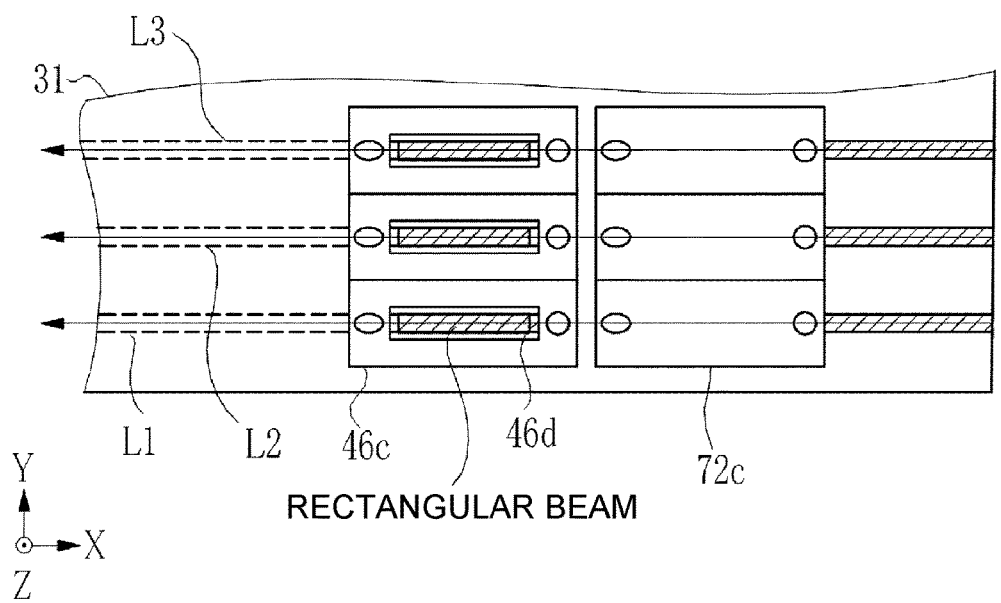
FIG. 24 is a diagram illustrating a doping process in the fourth embodiment.

FIGS. 22 and 23 illustrate the configuration of a laser doping device in a fourth embodiment. The laser doping device in the fourth embodiment is different in that this device includes a doping device 4D instead of the doping device 4B in the second embodiment. The laser system 3A is analogous to that in the first to third embodiments. However, the fourth embodiment is provided with a plurality of laser systems 3A. FIG. 22 is a configuration diagram of the doping device 4D in a case viewed from a side. FIG. 23 is a configuration diagram of the doping device 4D in a case viewed from a front. As illustrated in FIG. 24, the doping device 4D is a parallel process type doping device that performs doping over the plurality of doping lines L1 to L3 on the irradiation object 31 in parallel.

For example, the pulse laser light enters an optical system 71 from the three laser systems. The optical system 71 includes three optical systems respectively for the total three laser systems 3A; each optical system includes three highly reflective mirrors 52a to 52c and the beam homogenizer 54.

Each solution supply system 461 and the corresponding plate 46c are arranged in the Y axis direction.

Furthermore, in the X axis direction, a cleaning device 72 is provided at a position adjacent to each solution supply system 461. After the doping region 31e is irradiated with the pulse laser light, the cleaning device 72 cleans the doping region 31e wet with the solution 32.

Figure 25:
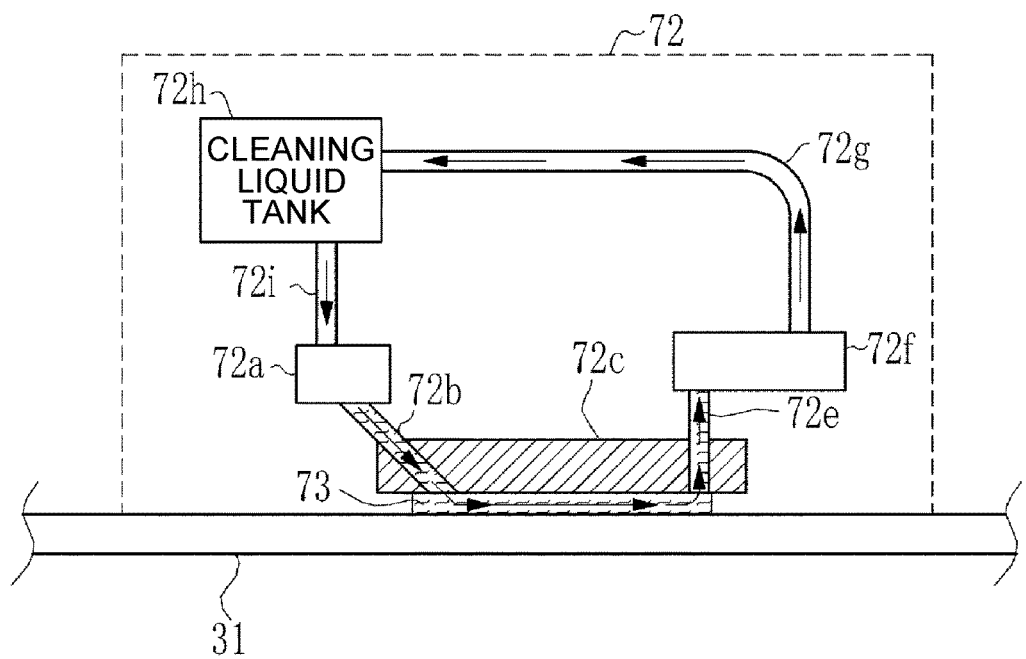
FIG. 25 illustrates a configuration of a cleaning device.

As illustrated in FIG. 25, each cleaning device 72 includes a supply pump 72a, a supply pipe 72b, a plate 72c, a discharge pipe 72e, a discharge pump 72f, a circulation pipe 72g, and a cleaning liquid tank 72h. The cleaning liquid tank 72h retains cleaning liquid. The cleaning liquid tank 72h communicates with the supply pump 72a via a pipe 72i. The output of the supply pump 72a communicates with the supply pipe 72b, which then communicates with a discharge port formed at the plate 72c. A discharge port is formed at the plate 72c, and the discharge port communicates with the discharge pipe 72e.

The discharge pipe 72e communicates with the discharge pump 72f. The discharge pump 72f communicates with the cleaning liquid tank 72h through the circulation pipe 72g. The cleaning liquid sucked by the discharge pump 72f is collected by the cleaning liquid tank 72h through the circulation pipe 72g. The cleaning liquid is, for example, diluted hydrofluoric acid aqueous solution or pure water.

Each cleaning device 72 is disposed such that the discharge port of the plate 72c coincides with the position of the window 46d of the corresponding solution supply system 461 in the Y axis direction.

6.2 Operation

The doping control unit 47 of the doping device 4D controls the XYZ stage 28 to align the irradiation object 31 such that one ends of the doping lines L1 to L3 on the irradiation object 31 coincides with the positions of the windows 46d of the respective solution supply systems 461 arranged in the Y axis direction. The doping control unit 47 controls the XYZ stage 28 to perform doping while moving the irradiation object 31 in the X axis direction. The movement direction is a direction in which the solution supply system 46 passes the doping region 31e on the irradiation object 31 and subsequently the cleaning device 72 passes.

The control for the solution supply system 461 and the laser system 3A performed by the doping control unit 47 is analogous to that in the second embodiment. The doping lines L1 to L3 are simultaneously irradiated with the respective rectangular beams through the windows 46d arranged in the Y axis direction. Thereby, doping is performed for the doping lines L1 to L3 in parallel.

During doping, the cleaning devices 72 are driven to clean the doping region 31e. According to the relative movement with respect to the irradiation object 31, the cleaning devices 72 pass the doping region 31e immediately after the windows 46d have passed. The cleaning device 72 continues to supply the cleaning liquid during doping. Consequently, the doping region 31e irradiated with the rectangular beam is supplied with the cleaning liquid. The solution 32 supplied to the doping region 31e is rinsed with the cleaning liquid. The washed-out solution 32 is collected by the cleaning device 72 together with the cleaning liquid.

6.3 Working Effect

In the fourth embodiment, doping can be achieved for the plurality of doping lines L1 to L3 in parallel. Consequently, the throughput of doping is improved. Accordingly, this is suitable for forming a TFT substrate for a large size screen that has a relatively large doping region 31e.

The doping region 31e is cleaned by rinsing the solution 32 by the cleaning device 72. Consequently, occurrence of residual and fixed dopant on the irradiation object 31 is suppressed.

7. Details of Pulse Laser Device

Figure 26:
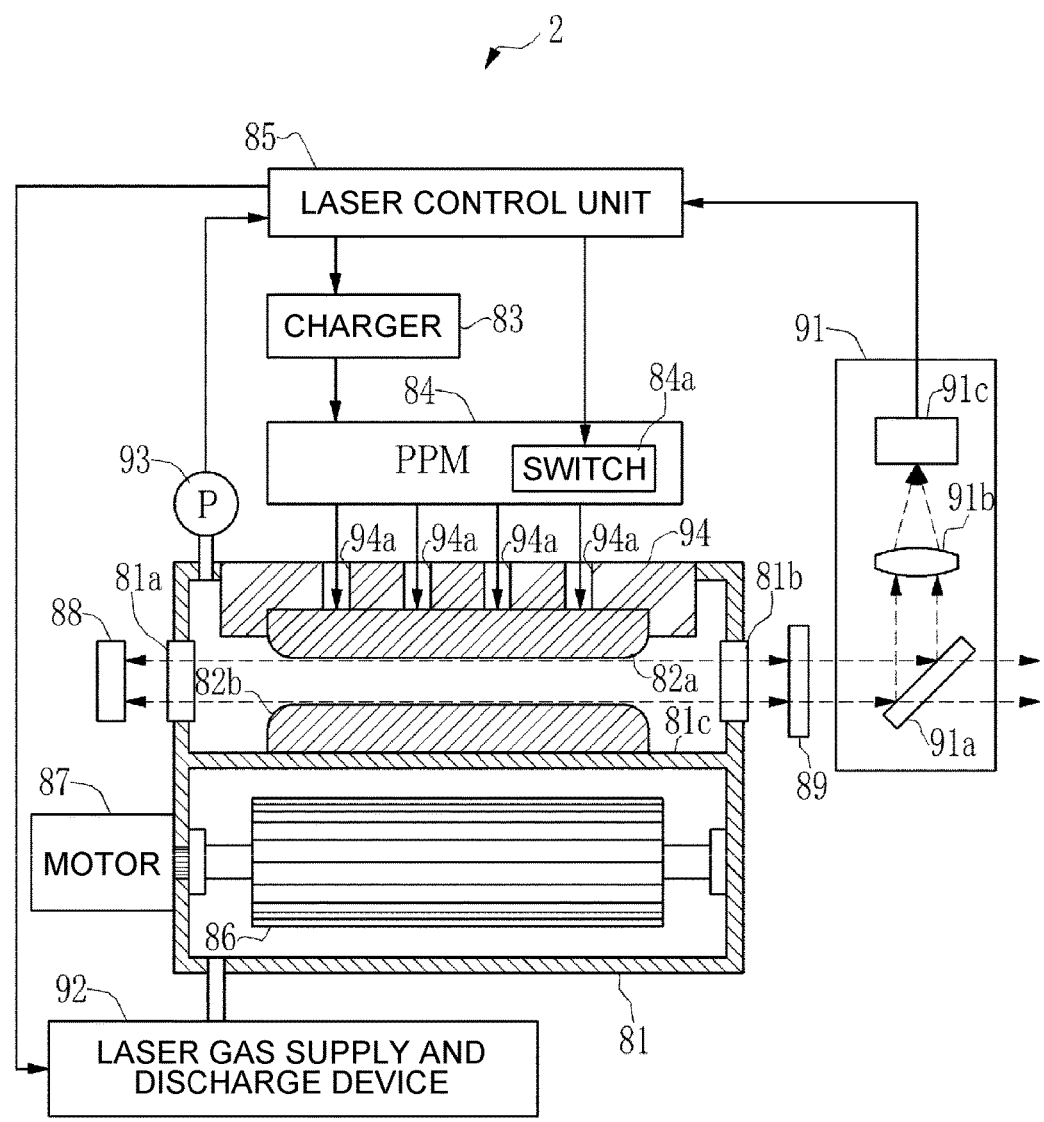
FIG. 26 illustrates a specific configuration of a pulse laser device.

FIG. 26 illustrates a specific configuration of the aforementioned pulse laser device. The pulse laser device 2 illustrated in FIG. 26 includes a laser chamber 81, a pair of electrodes 82a and 82b, a charger 83, and a pulse power module (PPM) 84. FIG. 26 illustrates the internal configuration of the laser chamber 81 in view of a direction substantially perpendicular to the travel direction of the laser light.

The pulse laser device 2 further include a cross flow fan 86, and a motor 87. The pulse laser device 2 further includes a highly reflective mirror 88, an output combining mirror 89, a pulse energy measurement unit 91, a laser control unit 85, and a laser gas supply and discharge device 92.

The laser chamber 81 is a chamber in which the aforementioned laser medium is enclosed. A pressure sensor 93 is connected to the laser chamber 81 via the piping so as to measure the pressure of the laser gas in the laser chamber 81. The pair of electrodes 82a and 82b are disposed, in the laser chamber 81, as electrodes for exciting the laser medium by discharge. An opening is formed at the laser chamber 81. This opening is blocked with an electric insulation portion 94. The electrode 82a is supported by the electric insulation portion 94. The electrode 82b is supported by an internal divider 81c of the laser chamber 81. Conductor portions 94a are embedded in the electric insulation portion 94. The conductor portions 94a electrically connect a high voltage terminal of the pulse power module 84 to the electrode 82a so as to apply, to the electrode 82a, a high voltage supplied from the pulse power module 84. The laser chamber 81 communicates with the laser gas supply and discharge device 92 through gas piping.

A rotational shaft of the cross flow fan 86 is connected to the motor 87 disposed outside of the laser chamber 81. The motor 87 rotates the cross flow fan 86, which circulates the laser gas in the laser chamber 81 so as to allow the gas to flow between the electrodes 82a and 82b.

The power supply device includes the charger 83 and the pulse power module 84. The pulse power module 84 includes a charging capacitor and a switch 84a. The output of the charger 83 is connected to the charging capacitor. The charger 83 holds electric energy for applying a high voltage between the pair of electrodes 82a and 82b. When the switch 84a controlled by the laser control unit 85 is turned ON from the OFF state, the pulse power module 84 generates a pulse-shaped high voltage from the electric energy held in the charging capacitor, and applies the high voltage to the pair of electrodes 82a and 82b.

Application of the high voltage between the pair of electrodes 82a and 82b causes discharge between the pair of electrodes 82a and 82b. The discharge energy excites the laser medium in the laser chamber 81, and causes transition to a high energy level. When the excited laser medium subsequently transitions to a low energy level, this medium emits light having a wavelength according to the energy level difference.

Windows 81a and 81b are provided at the opposite ends of the laser chamber 81. The light generated in the laser chamber 81 is emitted to the outside of the laser chamber 81 via the windows 81a and 81b.

The highly reflective mirror 88 reflects the light emitted from the window 81a of the laser chamber 81 with a high reflectance to return the light into the laser chamber 81.

The surface of the output combining mirror 89 is coated with a partial reflection film. Consequently, the output combining mirror 89 transmits and outputs a part of the light output through the window 81b of the laser chamber 81 while reflecting the other part and returning this part into the laser chamber 81.

The highly reflective mirror 88 and the output combining mirror 89 can constitute an optical resonator. The light emitted from the laser chamber 81 travels to and from between the highly reflective mirror 88 and the output combining mirror 89, and can be amplified every time of passing a laser gain space between the electrodes 82a and 82b. A part of the amplified light can be output as pulse laser light through the output combining mirror 89.

The pulse energy measurement unit 91 includes a beam splitter 91a, a condenser optical system 91b, and an optical sensor 91c. The beam splitter 91a transmits the pulse laser light having passed through the output combining mirror 89 with a high transmittance while reflecting a part of the pulse laser light toward the condenser optical system 91b. The condenser optical system 91b condenses the light reflected by the beam splitter 91a onto a light sensitive surface of the optical sensor 91c. The optical sensor 91c detects the pulse energy of the pulse laser light condensed on the light sensitive surface, and outputs detection data on the pulse energy to the laser control unit 85.

For example, the laser control unit 85 transmits a setting signal of the charged voltage to the charger 83, and transmits a light emission trigger signal of switch ON and OFF to the pulse power module 84. Furthermore, the laser control unit 85 controls the laser gas supply and discharge device 92 on the basis of the detected value of the pressure sensor 93 in order to control the pressure of the laser gas in the laser chamber 81.

The laser control unit 85 receives the detection data on the pulse energy from the pulse energy measurement unit 91, and controls the charged voltage of the charger 83 and the pressure of the laser gas in the laser chamber 81 with reference to the detection data on the pulse energy. The pulse energy of the pulse laser light is controlled by controlling the charged voltage of the charger 83 and the pressure of the laser gas. The laser control unit 85 may count the number of oscillation pulses of the excimer pulse laser device on the basis of the data received from the pulse energy measurement unit 91.

The description provided above is intended to provide just examples without any limitations. Accordingly, it will be obvious to those skilled in the art that changes can be made to the embodiments of the present disclosure without departing from the scope of the accompanying claims.

The terms used in the present description and in the entire scope of the accompanying claims should be construed as terms "without limitations". For example, a term "including" or "included" should be construed as "not limited to that described to be included". A term "have" should be construed as "not limited to that described to be held". Moreover, a modifier "a/an" described in the present description and in the accompanying claims should be construed to mean "at least one" or "one or more".

What is claimed is:

1. A laser doping device for doping polysilicon on a substrate with dopant, comprising:
    a solution supply system configured to supply a solution containing dopant to a doping region to be subjected to doping;
    a pulse laser system configured to output pulse laser light including a plurality of pulses, the pulse laser light transmitting through the solution and melting polysilicon in the doping region by allowing the doping region to be irradiated;
    an optical system configured to guide the pulse laser light output from the pulse laser system, to the doping region;
    a first control unit configured to control a number of pulses of the pulse laser light for allowing the doping region to be irradiated, and to control a fluence of the pulse laser light in the doping region; and
    a second control unit configured to control a flow velocity of the solution so as to move bubbles, from the doping region, occurring in the solution every time of irradiation with the pulse.

2. The laser doping device according to claim 1, wherein when the fluence per pulse is defined as FL, the fluence FL has a range of $330 mJ/cm^2 \leq FL \leq 430\ mJ/cm^2$.

3. The laser doping device according to claim 1, wherein when the number of pulses is defined as N, the number of pulses N has a range of $2 \leq N \leq 20$.

4. The laser doping device according to claim 1, wherein when a beam width of the pulse laser light allowing the doping region to be irradiated in a direction in which the solution including the dopant flows is defined as W, and a repetition frequency that is the number of pulses per unit time in the pulse laser light is defined as PF, the flow velocity V with which the dopant flows has a range $W \times PF \leq V \leq 20$ m/s.

5. The laser doping device according to claim 1, wherein the pulse laser light has a central wavelength ranging from 193 to 355 nm.

6. The laser doping device according to claim 1, wherein the solution is any of phosphoric acid aqueous solution, boric acid solution, and aluminum chloride aqueous solution.

7. The laser doping device according to claim 1, wherein the solution supply system includes a supply pump configured to supply the solution to the doping region, and the supply pump causes flow of the solution including the dopant, in the doping region.

8. The laser doping device according to claim 1, wherein the optical system guides the pulse laser light to a predetermined region including the doping region.

9. The laser doping device according to claim 8, wherein the predetermined region is formed to be a line on the substrate, and
    the laser doping device further comprises a stage configured to move the substrate in a direction of the line of the predetermined region.

10. The laser doping device according to claim 9, wherein the optical system converts the pulse laser light into a rectangular beam having a rectangular section orthogonal to an optical axis, and guides the converted rectangular beam to the predetermined region.

11. The laser doping device according to claim 9, wherein the optical system converts the pulse laser light into an array beam having a plurality of spot beams arranged in this array beam, and guides the converted array beam to the predetermined region.

12. The laser doping device according to claim 8, further comprising a cleaning device configured to clean the doping region after the doping region is irradiated with the pulse laser light.

* * * * *